US006506314B1

(12) United States Patent
Whitney, Jr. et al.

(10) Patent No.: US 6,506,314 B1
(45) Date of Patent: Jan. 14, 2003

(54) ADHESION OF POLYMERIC MATERIALS TO METAL SURFACES

(75) Inventors: Dickson L. Whitney, Jr., Gates Mills, OH (US); George S. Bokisa, North Olmsted, OH (US); Craig V. Bishop, Lakewood, OH (US); Americus C. Vitale, West Chester, PA (US)

(73) Assignee: Atotech Deutschland GmbH, Berlin (DE)

( * ) Notice: Subject to any disclaimer, the term of this patent is extended or adjusted under 35 U.S.C. 154(b) by 189 days.

(21) Appl. No.: 09/628,036

(22) Filed: Jul. 27, 2000

(51) Int. Cl.[7] .................................................. B44G 1/22

(52) U.S. Cl. .............................. 216/100; 216/2; 216/83; 428/174; 428/446; 428/607; 427/98; 427/96

(58) Field of Search .......................... 148/6.14; 96/35.1; 117/34; 156/630, 659; 427/98, 125, 96; 204/15; 428/607, 446; 106/1.22; 524/837; 205/111; 216/1–100

(56) References Cited

U.S. PATENT DOCUMENTS

| 2,364,993 A | 12/1944 | Meyer |
| 2,460,896 A | 2/1949 | Meyer |
| 2,460,898 A | 2/1949 | Meyer |
| 3,469,982 A | 9/1969 | Celeste |
| 3,645,772 A | 2/1972 | Jones |
| 4,260,449 A | 4/1981 | Berdan et al. |
| 4,642,161 A | 2/1987 | Akahoshi et al. |
| 4,657,632 A | 4/1987 | Hotlzman et al. |
| 4,882,202 A | 11/1989 | Holtzman et al. |
| 5,017,271 A | 5/1991 | Whewell et al. |
| 5,073,456 A | 12/1991 | Palladino |
| 5,554,211 A | 9/1996 | Bokisa et al. |
| 5,712,047 A | 1/1998 | Aso et al. |

(List continued on next page.)

FOREIGN PATENT DOCUMENTS

| JP | 56-118394 | 9/1981 |
| JP | 8-97559 | 4/1996 |
| WO | WO96/17975 | 6/1996 |
| WO | WO96/19097 | 6/1996 |
| WO | WO99/40764 | 8/1999 |

OTHER PUBLICATIONS

"Polyclad" Data Sheet, Four page printout from Website at http://www.polyclad–usa.com/pcl–DTSFoil_LowDCF–.htm, Dec. 1999.
Michael Flatt, "Printed Circuit Board Basics" Second Edition, Dec. 1992 (all pages).

Primary Examiner—Randy Gulakowski
Assistant Examiner—Gentle E. Winter
(74) Attorney, Agent, or Firm—Renner, Otto, Boisselle & Sklar, LLP

(57) ABSTRACT

The present invention relates to a process for treating a metal substrate to improve adhesion of polymeric materials thereto, comprising the steps of intergranular etching a surface of the metal substrate; and applying an immersion plated metal to the intergranular etched surface by immersing the surface in an immersion plating composition comprising one or more plating metals selected from tin, silver, bismuth, copper, nickel, lead, zinc, indium, palladium, platinum, gold, cadmium, ruthenium, cobalt, gallium and germanium. In one embodiment, the immersion plated metal is tin. In one embodiment, the process further comprises a step of adhering the immersion metal plated surface to a surface of a polymeric non-conductive material. In another embodiment, the polymeric nonconductive material is one or more of PTFE, an epoxy resin, a polyimide, a polycyanate ester, a butadiene terephthalate resin, or mixtures thereof. In one embodiment, the process further comprises a step of applying a silane over the immersion plated metal from an aqueous solution of a silane.

78 Claims, 6 Drawing Sheets

U.S. PATENT DOCUMENTS

| | | |
|---|---|---|
| 5,733,599 A | 3/1998 | Ferrier et al. |
| 5,800,859 A | 9/1998 | Price et al. |
| 5,807,493 A | 9/1998 | Maki et al. |
| 5,869,130 A | 2/1999 | Ferrier |
| 5,907,015 A | 5/1999 | Sexsmith |
| 5,928,790 A | 7/1999 | Bokisa |
| 6,036,758 A | 3/2000 | Fairweather |
| 6,042,711 A | 3/2000 | Sadey et al. |
| 6,086,779 A | 7/2000 | Bishop et al. |
| 6,242,079 B1 * | 6/2001 | Mikado et al. ............. 174/250 |

\* cited by examiner

ADHESION OF POLYMERIC MATERIALS TO METAL SURFACES

FIELD OF THE INVENTION

In one embodiment, this invention relates to a process for improving adhesion of polymeric materials to metal substrates including the steps of intergranular etching a surface of the metal substrate and applying to the intergranular etched metal surface an immersion plated metal, and in another embodiment, the invention relates to a foil having a surface with improved adhesion to polymeric materials. The intergranular etching produces a highly irregular surface profile including deep intergranular crevices. The immersion plated metal is applied from an immersion plating solution which includes one or more plating metals selected from tin, silver, bismuth, copper, nickel, lead, zinc, indium, palladium, platinum, gold, cadmium, ruthenium, cobalt, gallium and germanium and mixtures or alloys thereof. The surface obtained by this process provides enhanced adhesion between the metal substrate and polymeric materials applied to the surface of the metal substrate.

BACKGROUND OF THE INVENTION

Many highly varied processes of chemically or physically treating the surface of a metal substrate, such as copper, to improve the bonding of the metal to a polymeric material, such as epoxy or polyimide, are used in industries such as printed circuit board (PCB) fabrication. PCBs generally comprise non-conducting or dielectric layers such as a fiberglass/epoxy sheets which are clad with a metal conductive layer such as copper or a copper alloy on one or both surfaces. The metal layer of the PCB, before processing, typically is a continuous layer of copper which may be interrupted by a pattern of plated through-holes linking both surfaces of the board. During processing, selected portions of the copper layer are removed to form a raised copper circuit image pattern, i.e., circuitry. Multilayer PCB's are typically constructed by inter-leaving such circuit-bearing conductive layers with dielectric adhesive layers into a multilayer sandwich which is then bonded together by applying heat and pressure. The dielectric adhesive layer is often a partially cured B-stage resin, referred to as a prepreg. Production of these types of PCB's is described in "Printed Circuits Handbook," Fourth Edition, Edited by C. F. Coombs, Jr., McGraw-Hill, 1996, and in "Printed Circuit Board Basics", Second Edition, by Michael Flatt, Miller-Freeman, 1992, the teachings relating to PCB manufacture of both are incorporated herein by reference. Since the conductive layer with an untreated surface does not bond well to the prepreg, various surface treatments have been developed to increase the bond strength between the layers of the multilayer PCB sandwich.

Originally such treatments consisted of oxidizing the metal surface with treatments such as alkaline chlorite solutions (e.g., U.S. Pat. Nos. 2,364,993, 2460,896, and 2,460,898). Over time the treatment evolved (e.g., Slominski and Landau, "Adhesion Promoting Copper Oxide for Plastic on Printed Circuit Boards" *Plating*, June 1982 pp. 96–99) and the oxide became a 'reduced oxide' (e.g., U.S. Pat. No. 4,642,161). By utilization of a reduced oxide, multilayer printed wiring boards were less prone to a problem known as 'pink ring' where oxide is dissolved adjacent to drilled holes during subsequent through hole plating processes. These methods suffer from several drawbacks. The resulting oxide and reduced oxide treatment surfaces are fragile. Thus, processing was typically done by dipping individual parts into solutions. This method of manufacture is not conducive to high volume manufacturing which generally prefers continuous processing such as horizontal conveyorized treatment. Further, due to possible re-oxidation by atmospheric oxygen, reduced oxide treatment requires that layers be bonded (or be otherwise treated or stored to protect from atmospheric oxygen) within a relatively short time (typically less than 48 hours), which also adversely impacts manufacturing time and costs.

Horizontal conveyorized treatment methods eliminating pink ring (Americus C. Vitale, "DuraBOND Process Eliminates Pink Ring and Wedge Void Defects." *IPC 32$^{nd}$ Annual Meeting*, (April 1989), and allowing extended storage time for the layers (e.g., U.S. Pat. No. 5,073,456) have been developed. Such methods are widely used, employing, e.g., a process sequence comprising immersion tin plating followed by an organosilane coupling agent treatment from, e.g., an aqueous solution. The '456 patent teaches that the immersion tin coatings alone are insufficient to form a direct bond between the electrically conductive layer (e.g., copper) surface and a dielectric material. The organosilane coupling agent is provided by the '456 patent as a solution to this problem.

The process of the '456 patent includes a step referred to as microetching, in which the surface of the metal is briefly treated to form a clean, uniform, microetched surface. In the present specification, the term "microetched" includes cleaning and/or pretreating methods in which an amount of metal equivalent to less than 40 microinches, usually less than 20 microinches, is removed from the surface of the treated metal substrate and in which, after the microetching, the surface is quite regular, being substantially free of deep intergranular crevices and steep-sided ridges and valleys.

The method for calculating the amount of metal removed in an etching process is based on the weight loss of a coupon of metal of a given area, which provides an average of the actual etch depth. This method is more fully described below. Such microetching results in a uniform, lightly microetched metal surface which facilitates application of a tin oxide/hydroxide layer by immersion plating, and which is relatively smooth. Such metal surfaces are free of deep, intergranular crevices, although some relatively isolated, angular-sided copper grains may be exposed on the microetched surface.

Recently a 'new generation' of continuous (e.g., horizontal conveyorized) processing methods which use neither immersion tin nor silane treatments to promote adhesion of a metal surface to a polymeric material has been taught (e.g., WO 96/17975, U.S. Pat. No. 5,869,130, WO 99/40764). These methods rely on the resulting roughness and high irregularity of the surface for mechanical enhancement of adhesion between the metal substrate and a polymeric material, such as a prepreg. These methods typically employ a strong acid/oxidizing agent intergranular etching solution, such as a sulfuric acid/hydrogen peroxide solution, modified by the addition of an inhibitor such as benzotriazole (or related compounds) and other additives, such as quaternary ammonium chloride surfactants, sodium chloride, or triphenyl-sulfonium chloride. These methods produce an intergranular etch of the metal surface resulting in a surface morphology characterized by the presence of steep-sided ridges and valleys and/or deep intergranular crevices, and may include a light coating of an oxide over the entire surface. In some cases the solutions include an additional inhibitor such as sodium meta-nitrobenzene sulfonate (U.S. Pat. No. 6,036,758).

Another 'new generation' continuous processing method (U.S. Pat. No. 5,807,493) also produces an intergranular etch, including deep intergranular crevices as described above, but does not result in an oxide uniformly over the surface. This method employs an etching chemistry based upon an organic acid having a $pK_a$ of at least 5, such as formic acid, with copper ion and chloride ion, to produce the intergranular etch. The etch step is followed by a desmutting step (e.g. hydrochloric acid 'pickling').

Methods for improving adhesion of metallic substrates to non-conductive, polymeric surfaces of PCBs have included application of additional metal layers by electrodeposition, e.g., Luce et al, U.S. Pat. No. 4,260,449 and Sadey et al, U.S. Pat. No. 6,042,711, and by immersion tin plating, e.g., Holtzman et al, U.S. Pat. No. 4,882,202 and Bokisa, U.S. Pat. No. 5,928,790. The electrodeposition processes provide improved peel strengths, but are time- and energy-intensive. The immersion tin processes have not yielded peel strengths which are significantly better than the above-described intergranular etching processes.

U.S. Pat. No. 4,882,202 describes many prior art processes for improving the bonding strength between a metal substrate and a laminated non-conductive polymeric layer applied thereto. Among the prior art process described is microetching the copper with ammonium persulfate or hydrogen peroxide, although the '202 patent states that only slightly improved bonding strengths were obtained as a result. The '202 patent describes an improved immersion tin plating process which includes both a thiourea compound and a urea compound as bath additives. The '202 patent states that its process allows coating of metal substrates with substantially no pre-cleaning, and that it is not necessary to treat the metal surface (such as by etching) to remove oil or metal oxides. However, the '202 patent fails to provide any evidence that its process actually improves the peel strengths of PCBs made with its process, as compared to the prior art.

U.S. Pat. No. 5,928,790 describes a process for making multilayer PCBs, including a step of immersion metal plating followed by a step of applying a silane to improve the bond strength between a metal substrate and a laminated non-conductive polymeric layer applied thereto.

SUMMARY OF THE INVENTION

The present inventors have discovered that subsequent immersion metal plating treatment of intergranular etched foils with an immersion plated metal provides an unexpectedly significant increase in the peel strengths of such foils and that this invention can be utilized without significantly increasing production costs. The present application discloses and claims the newly discovered methods.

The present invention relates to a process for treating a metal substrate to improve adhesion of polymeric materials thereto, comprising the steps of intergranular etching a surface of the metal substrate; and applying an immersion plated metal to the intergranular etched surface by immersing the surface in an immersion plating composition comprising one or more plating metals selected from tin, silver, bismuth, copper, nickel, lead, zinc, indium, palladium, platinum, gold, cadmium, ruthenium, cobalt, gallium and germanium. In one embodiment, the immersion plated metal is tin. In one embodiment, the process further comprises a step of applying a silane over the immersion plated metal from an aqueous solution of a silane. In one embodiment, the process further comprises a step of adhering the immersion metal plated surface to a surface of a polymeric non-conductive material.

In this invention the performance of the 'new generation' of horizontal processing methods is improved by treating the intergranular etched surface of the metal substrate with an immersion plated metal. This treatment process optionally may be followed by treatment with one or more silanes from aqueous solution. As a result, improved adhesion of polymeric materials to the conductive metal foil, e.g., copper foil used in, e.g., PCB laminates, may be attained, compared to foils made by previous processes.

DETAILED DESCRIPTION

Figure 1:
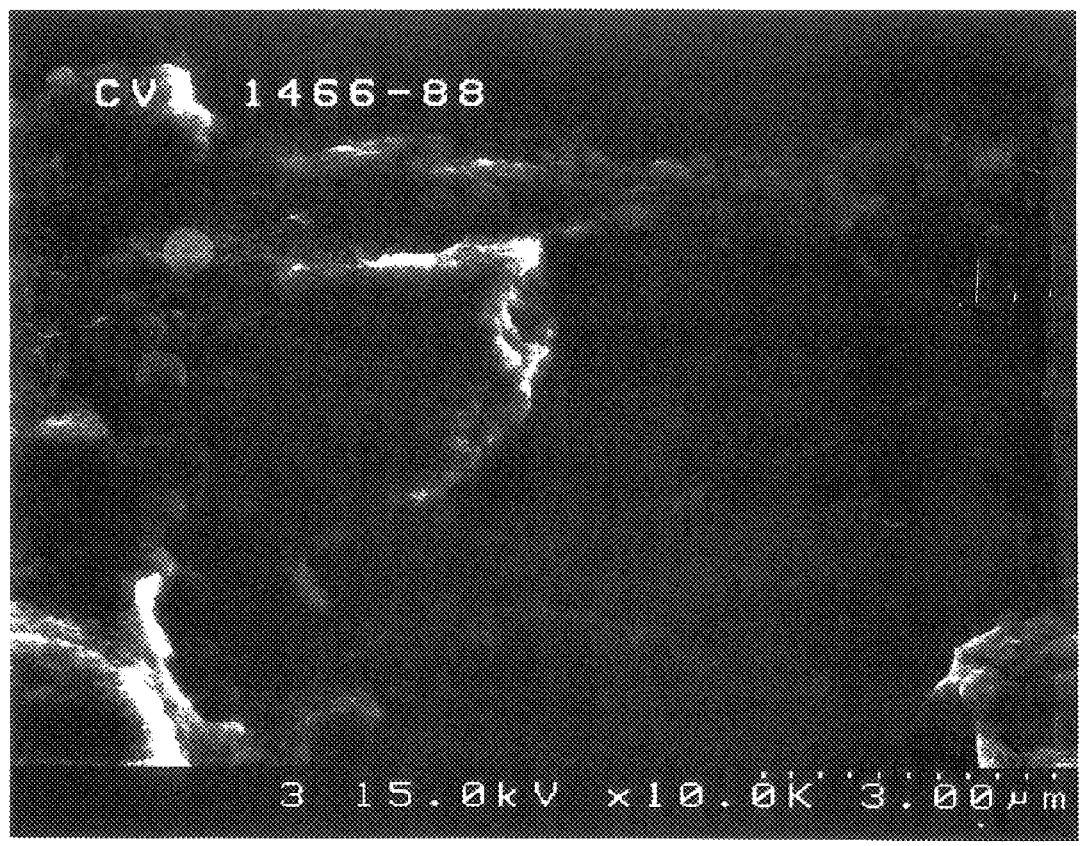
FIG. 1 is a photomicrograph of the drum side of a copper foil.

The methods of the present invention provide printed circuit boards (PCBs) having improved adhesion between the metal layer of the conductive circuit elements and the non-conductive, polymeric portions of the PCB, by applying a process for treating a metal substrate to improve adhesion thereto of polymeric materials, comprising the steps of (A) intergranular etching the surface of the metal substrate, with an intergranular etching composition, and (B) applying an immersion plated metal to the intergranular etched surface by immersing the surface in an immersion plating composition comprising one or more plating metals selected from one or more plating metals selected from tin, silver, bismuth, copper, nickel, lead, zinc, indium, palladium, platinum, gold, cadmium, ruthenium, cobalt, gallium and germanium. In one embodiment the immersion plated metal is tin.

Various processes for obtaining an intergranular etched surface on a metal foil and for applying immersion plated metal layers to metal foils are known. The present invention incorporates suitable intergranular etching steps and immersion plating steps. These steps may optionally be followed by application of a silane, preferably from an aqueous solution of at least one silane. In general, the process of the present invention results in a metal foil having significantly improved adhesion to non-conductive polymeric layers, as disclosed hereinbelow. The metal foil produced by the present invention may be adhered to such a non-conductive polymeric material by lamination subsequent to the steps described herein for treating the metal substrate. The polymeric non-conductive material may be selected from polytetrafluoroethylene (PTFE), one or more epoxy resins, one or more polyimides, one or more polycyanate esters, one or more butadiene terephthalate resins, or mixtures of these, and to other known non-conductive laminating materials.

In a preferred embodiment, the method is carried out in a continuous process, such as on horizontal, conveyorized, production lines. Such continuous processes typically operate with a continuous conveyor which carries sheets or panels of metal foil and/or laminate through the production process. In such continuous processes, the metal foil may favorably move in a generally horizontal direction as it proceeds through the process. It is, of course, not necessary to the invention that the process operate in a continuous fashion or that the metal foil move in a horizontal direction, but such is generally preferred for engineering reasons. The present invention particularly lends itself to such horizontal, conveyorized processing. Therefore, it is a feature of the present invention that the disclosed process allows for and most beneficially is used in continuous processes in which the metal foil being processed moves on conveyorized production lines in a generally horizontal direction.

The copper foils used with this invention are made using one of two techniques. Wrought or rolled copper foil is produced by mechanically reducing the thickness of a copper or copper alloy strip or ingot by a process such as rolling. Electrodeposited copper foil is produced by electrolytically depositing copper ions on a rotating cathode drum and then peeling the deposited foil from the cathode. Electrodeposited copper or copper-alloy foils are especially useful with this invention and are preferred. Foils of metals other than copper may be produced by similar, known processes.

When the metal substrates are metal foils, they typically have nominal thicknesses ranging from about 2.5 $\mu$m to about 500 $\mu$m or more. Foil thickness, and particularly copper foil thickness, may be expressed in terms of weight and typically the foils of the present invention have weights or thicknesses ranging from about ⅛ to about 14 ounces per square foot (oz/ft$^2$). Especially useful copper foils are those having weights of ½, 1 or 2 oz/ft$^2$.

Such metal foils may be provided in various panel sizes, such as 18"×24", 12"×18" or 20" by 26". Each panel generally comprises a plurality of sections, each of which will eventually become a single conductive layer of a PCB.

(A) Intergranular Etching

A number of intergranular etching processes are known, and any process which results in an intergranular etched surface as defined herein is suitable for use with the present invention. Thus, a suitable intergranular etching step results in a metal foil having a highly irregular surface, characterized by the presence of steep-sided ridges and/or deep intergranular crevices. At least a portion of the intergranular crevices have an aspect ratio, i.e., the ratio of crevice depth to crevice width, of at least about 1. The aspect ratios of the intergranular crevices are discussed in more detail below. At least a portion of the intergranular crevices have a depth of at least about 1 micron. The intergranular etching processes of the present invention remove, on average, from about 25 microinches to about 120 microinches ($\mu$in; 1 $\mu$in ≅25.4 nm=0.0254 $\mu$m; 1 $\mu$m=39.4 $\mu$in) of metal from the surface of the metal substrate. The method for determining the amount of metal removed is provided below. In some embodiments, the intergranular etched surface is covered by a thin layer of metal oxide. When present, the layer of metal oxide is relatively thin as compared to the depth of the irregularities in the surface of the metal foil. The layer of metal oxide has a thickness ranging from about 0.008 $\mu$m to about 2 $\mu$m. In one embodiment, the metal oxide has a thickness in the range from about 0.008 $\mu$m to about 0.08 $\mu$m. In one embodiment, the intergranular etched foil is substantially free of an oxide layer.

In one embodiment, referred to herein as the "peroxide/sulfonic" embodiment (U.S. Pat. No. 6,036,758), the present process includes a step of intergranular etching which is carried out with an intergranular etching composition comprising from about 5 g/l to about 50 g/l hydrogen peroxide and about 0.1 g/l to about 50 g/l of an aromatic sulfonic acid or a salt thereof, such as sodium m-nitrobenzene sulfonate. The peroxide/sulfonic intergranular etching composition is an aqueous solution of the various components. In one embodiment, the aromatic groups of the sulfonic acid or salt thereof are carbocyclic rings. In another embodiment, the aromatic sulfonic acids are benzene sulfonic acids. In another embodiment, the aromatic sulfonic acids are fused ring compounds such as naphthalene sulfonic acids. In another embodiment, the aromatic sulfonic acids are substituted by one or more substituents, e.g., substituents selected from nitro, hydroxy, halogen, lower ($C_{1-6}$) alkyl, lower ($C_{1-6}$) alkoxy and other substituents. In another embodiment, the aromatic groups may carry one or more sulfonic acid groups. In another embodiment, the sulfonic acid is present as a salt. In one embodiment, the salts are alkali metal salts. In one embodiment, the salt is the sodium salt. In one embodiment, the sulfonic acid is m-nitrobenzene sulfonic acid, particularly in the form of its sodium salt. In other embodiments, the sulfonic acids may include 1,3-disulfonic acid and naphthalene-1,3,8-trisulfonic acid. In these embodiments, these acids may be present in the form of alkali metal salts, in particular sodium salts.

In one embodiment of the peroxide/sulfonic intergranular etching composition, the sulfonic acid is present in the composition of the peroxide/sulfonic embodiment at a concentration of less than 50 g/l. In another embodiment, the sulfonic acid is present from about 0.1 g/l to about 50 g/l. In another embodiment, the sulfonic acid is present from about 50 g/l to about 100 g/l. In another embodiment, the sulfonic acid is present from about 1 to about 20 g/l. In another embodiment, the sulfonic acid is present from about 1 to about 10 g/l.

In one embodiment of the peroxide/sulfonic intergranular etching composition, the oxidizing agent is hydrogen peroxide. In other embodiments, the oxidizing agent may be ferric nitrate, ferric sulfate, sodium persulfate, etc.

The oxidizing agent is generally present in the composition at such a concentration as to produce a conversion of the copper surface from a substantially smooth surface to a substantially intergranular etched surface. In one embodiment, the concentration of hydrogen peroxide present in the composition may be less than about 50 g/l. In another embodiment, the hydrogen peroxide is present in the range from about 5 to about 35 g/l. In another embodiment, the hydrogen peroxide is present from about 50 g/l to about 100 g/l. In another embodiment, the hydrogen peroxide is present in the range from about 15 g/l to about 25 g/l.

In one embodiment of the peroxide/sulfonic intergranular etching composition, the composition may further include an inorganic acid. Any suitable inorganic acid may be utilized. In one embodiment, the acid is sulfuric acid. In an embodiment in which the inorganic acid is sulfuric acid, the acid is present in the composition at a concentration from about 20 g/l to about 200 g/l. In another embodiment, the sulfuric acid is present at a concentration from about 20 g/l to about 150 g/l. In another embodiment, the acid is present at a concentration from about 50 g/l to about 100 g/l. In another embodiment the acid is present at a concentration of about 75 g/l.

In one embodiment of the peroxide/sulfonic intergranular etching composition, the composition includes a corrosion inhibitor. Suitable corrosion inhibitors are those which are conventionally used for this purpose. Examples include triazoles, tetrazoles and imidazoles, and mixtures thereof. In one embodiment, the corrosion inhibitor is benzotriazole. In an embodiment in which the corrosion inhibitor is benzotriazole, the concentration thereof may be in the range from about 1 g/l to about 20 g/l. In another embodiment, the concentration of the corrosion inhibitor is less than about 10 g/l. In another embodiment, the concentration of the corrosion inhibitor is less than about 5 g/l. In another embodiment, the concentration of the corrosion inhibitor is less than about 0.1 g/l. In another embodiment, the concentration is about 0.4 g/l.

One embodiment of the peroxide/sulfonic intergranular etching composition contains no components other than water, the oxidizing agent, an inorganic acid, the corrosion inhibitor and the sulfonic acid or salt thereof. In particular, it is unnecessary to include a surfactant in the composition.

The amount of metal removed is in the range from at least 40 μin to about 120 μin. The surface of the metal substrate, following intergranular etching with the peroxide/sulfonic embodiment, is characterized by the presence of intergranular crevices and steep-sided ridges and valleys, when examined by electron microscope.

In another embodiment (U.S. Pat. No. 5,807,493), referred to herein as the "cupric chloride embodiment," the process includes a step of intergranular etching which is carried out with an intergranular etching composition comprising (a) a cupric ion source, (b) an organic acid with an acid dissociation constant (pKa) of 5 or lower, (c) a halide ion source, and (d) water. This intergranular etching process of this embodiment may use as the cupric ion source one or more compound(s) selected from a cupric salt of an organic acid, cupric chloride, cupric bromide and cupric hydroxide.

The organic acid of the cupric chloride intergranular etching composition, which has an acid dissociation constant (pKa) of 5 or lower, is one or more acid(s) selected from formic acid, acetic acid, propionic acid, butyric acid, valeric acid, caproic acid, acrylic acid, crotonic acid, isocrotonic acid, oxalic acid, malonic acid, succinic acid, glutaric acid, adipic acid, pimelic acid, maleic acid, benzoic acid, phthalic acid, cinnamic acid, glycolic acid, lactic acid, malic acid, citric acid, sulfamic acid, β-chloropropionic acid, nicotinic acid, ascorbic acid, hydroxyl pivalic acid and levulinic acid. In one embodiment, the acid is formic acid, and in another embodiment the acid is acetic acid. In one embodiment, the acid is a mixture of two of the foregoing acids.

The amount of organic acid in one embodiment of the cupric chloride intergranular etching composition is preferably in the range of about 0.1% to about 30% by weight of the composition (hereinafter simply indicated as "%"). In one embodiment, the amount of organic acid is in the range from about 2% to about 20%. In one embodiment, the amount of organic acid is in the range from about 5% to about 10%.

Halide ions used in the cupric chloride intergranular etching composition assist the dissolving of the copper and contribute to production of copper surfaces with superior adhesiveness and solderability. In one embodiment, the halide ion source is one or more compound(s) selected from hydrochloric acid, hydrobromic acid, sodium chloride, calcium chloride, potassium chloride, ammonium chloride, potassium bromide, copper chloride, copper bromide, zinc chloride, iron chloride, and tin bromide. Of these, the copper chloride and copper bromide are preferred, since these salts provide both the cupric ion and the halide ion. However, in cases in which the concentration of cupric ion and halide ion are desired to be other than the stoichiometric ratio of the cupric halide, it may be necessary to combine sources of cupric ion and halide ion. The amount of halide ion in the cupric chloride intergranular etching composition, measured based on the weight of the halide ion, is in the range of about 0.01% to about 20% by weight of the composition. In one embodiment, the amount of halide ion is in the range from about 1% to about 5%.

The cupric ion source compound used in the cupric chloride intergranular etching composition functions as an oxidizing agent to oxidize metals such as copper or the like. The use of the cupric ion source compound as the oxidizing agent results in the intergranular etching composition adequately intergranular etching the surface of the metal in terms of speed and depth of irregularities produced. In one embodiment, the content of the cupric ion source compounds in the intergranular etching composition of this embodiment, in terms of the amount of metallic copper, is about 0.01% to about 20% by weight of the composition. In another embodiment, the amount of copper is from about 0.1 to about 10%. In another embodiment, the amount of copper is from about 2 to about 5%.

In addition to the above components, the cupric chloride intergranular etching composition may be formulated with additives such as an organic acid salt of sodium, potassium, or ammonium to reduce fluctuation in the pH during the intergranular etching treatment; a complexing agent such as ethylenediamine, pyridine, aniline, ammonia, monoethanolamine, diethanolamine, triethanolamine, and N-methyldiethanolamine to improve the solution stability of copper; and various other known additives for such compositions.

The amount of metal removed is in the range from at least 25 μin to about 120 μin. The surface of the metal substrate, following intergranular etching with the cupric chloride embodiment, is characterized by the presence of intergranular crevices and steep-sided ridges and valleys, when examined by electron microscope.

In another embodiment (U.S. Pat. No. 5,869,130), referred to herein as the "inhibitor/chloride" embodiment, the intergranular etching composition of the present invention comprises (a) an oxidizer; (b) an acid; (c) a corrosion inhibitor; and (d) a source of halide ions. The intergranular etching composition of this embodiment may also include a water soluble polymer.

In one embodiment of the inhibitor/chloride intergranular etching composition, the oxidizer is selected from the group consisting of hydrogen peroxide and persulfates. In one embodiment, the concentration of the oxidizer is from about 6 to about 60 grams per liter (g/l). In one embodiment, the concentration of the oxidizer is from about 12 g/l to about 30 g/l.

In one embodiment of the inhibitor/chloride intergranular etching composition, the acid is any acid which is stable in the matrix. In another embodiment of the intergranular etching composition, the acid is a mineral acid. In another embodiment of the intergranular etching composition, the acid is a sulfuric acid.

In one embodiment of the inhibitor/chloride intergranular etching composition, the acid is present in a concentration in the range from about 5 g/l to about 360 g/l. In another embodiment of the intergranular etching composition, the acid is present in a concentration in the range from about 70 g/l to about 110 g/l.

Although not wishing to be bound by theory, it is believed that when an inhibitor is used in the various intergranular etching compositions, it effectively reacts with the metal surface to form a protective complex layer. It is believed that the corrosion inhibitor contributes to the irregularity of the resulting surface, since it prevents or substantially reduces etching of some areas, while deep etching proceeds in other areas, unprotected by the inhibitor. The corrosion inhibitor may be one or more of triazoles, benzotriazoles, tetrazoles, imidazoles, benzimidazoles and mixtures of the foregoing.

The concentration of the corrosion inhibitor in the inhibitor/chloride intergranular etching composition may range from about 1 g/l to about 20 g/l. In another embodiment, the concentration of the corrosion inhibitor is from about 6 g/l to about 12 g/l.

The source of halide ions in the inhibitor/chloride intergranular etching composition may be any compound which would provide halide ions in the matrix of the adhesion-promoting composition. In one embodiment of the inhibitor/chloride intergranular etching composition, the source of halide ions is one or more alkaline earth salts such as sodium chloride or potassium chloride, oxohalides such as sodium chlorate or potassium chlorate, or halide bearing mineral acids such as hydrochloric acid. In another embodiment, the source of halide ions provides chloride ions to the adhesion-promoting composition.

The concentration of the source of halide ions in the inhibitor/chloride intergranular etching composition, based on the halide ion content, may range from about 5 to about 500 milligrams per liter (mg/l). In one embodiment, the concentration of halide ions is from about 10 to about 50 mg/l.

In one embodiment, the inhibitor/chloride intergranular etching composition comprises a water soluble polymer selected from polymers of ethylene oxide, ethylene oxide-propylene oxide copolymers, polyethylene glycols, polypropylene glycols, polyvinyl alcohols, and mixtures of the foregoing.

The amount of metal removed is in the range from at least 40 μin to about 120 μin. The surface of the metal substrate, following intergranular etching with the inhibitor/chloride intergranular etching composition, is characterized by the presence of intergranular crevices and steep-sided ridges and valleys, when examined by electron microscope.

In one embodiment (U.S. Pat. No. 5,800,859-WO 96/19097), referred to herein as the "inhibitor/surfactant" embodiment, the process includes a step of intergranular etching which is carried out with an intergranular etching composition comprising 0.1 to 20% by weight hydrogen peroxide, an inorganic acid, an organic corrosion inhibitor and a surfactant.

Hydrogen peroxide is present in the inhibitor/surfactant intergranular etching composition at a concentration of at least about 0.01% active hydrogen peroxide by weight of the composition. In one embodiment, the hydrogen peroxide is present at a concentration of at least 1.0%. In another embodiment, the concentration of hydrogen peroxide is no greater than 20%. In another embodiment, the concentration of hydrogen peroxide is no greater than about 10%. In another embodiment, the concentration of hydrogen peroxide is no greater than 5%. In another embodiment, the concentration of hydrogen peroxide is no greater than 4%. In another embodiment, the concentration of hydrogen peroxide is in the range from about 0.5% to about 4%.

In one embodiment of the inhibitor/surfactant intergranular etching composition of the present embodiment, the inorganic acid is selected from phosphoric acid, nitric acid, sulphuric acid, or mixtures thereof. In one embodiment, the inorganic acid is sulfuric acid.

The concentration of acid in the inhibitor/surfactant intergranular etching composition is generally at least about 1% by weight of the composition. In one embodiment the concentration of acid is at least about 8%. In another embodiment the concentration of acid is at least about 9%. Generally the concentration of acid in the composition will be no greater than about 50%. In another embodiment the concentration of acid is no greater than about 30%. In another embodiment the concentration of acid is no greater than about 20%.

The corrosion inhibitor in the inhibitor/surfactant intergranular etching composition is usually one or more selected from triazole, tetrazole and imidazole, and mixtures thereof. In one embodiment, the corrosion inhibitor is a triazole. In another embodiment, the corrosion inhibitor is a substituted benzotriazole. Suitable substituents are, for example, $C_{1-4}$ alkyl substituents.

In one embodiment, the corrosion inhibitor is present in the inhibitor/surfactant intergranular etching composition in an amount of at least 0.0001% by weight of the composition. In another embodiment, the corrosion inhibitor is present at a concentration of at least 0.0005%. In another embodiment, the corrosion inhibitor is present at a concentration of at least 0.1%. In another embodiment, the corrosion inhibitor is present at a concentration of more than 0.5%. In another embodiment, the corrosion inhibitor is present at a concentration of more than 1%. Generally, the corrosion inhibitor will be present in the composition in an amount no greater than 20%. In another embodiment, the corrosion inhibitor is present at a concentration of no greater than 10%. In another embodiment, the corrosion inhibitor is present at a concentration of less than 5%. In another embodiment, the corrosion inhibitor is present at a concentration of less than 1%.

The surfactant is preferably a cationic surfactant, usually an amine surfactant. In one embodiment, the surfactant is a quaternary ammonium surfactant. In another embodiment, the quaternary ammonium surfactant is one or more ethoxylated fatty amines. In another embodiment, the quaternary ammonium surfactant is a $C_{10-40}$ surfactant, that is, a surfactant comprising at least one, preferably one, $C_{10-20}$ alkyl group. Suitable surfactants may have at least one, preferably two, hydroxy-substituted lower alkyl groups, that is, $C_{1-4}$ hydroxyalkyl, and one or, less preferably, two lower alkyl, that is, $C_{1-4}$ alkyl groups, attached to the nitrogen atom. In another embodiment, the quaternary ammonium surfactants are isodecyloxypropyl dihydroxyethyl methyl ammonium chloride and isotridecyloxypropyl dihydroxyethyl methyl ammonium chloride.

Generally the surfactant in the inhibitor/surfactant intergranular etching composition will be present in the composition in an amount of at least 0.001% by weight of the composition. In one embodiment, the surfactant is present at a concentration of at least 0.005%. In another embodiment, the surfactant is present at a concentration of 0.01%. Generally, the surfactant will be present in the composition in amounts no greater than about 5%. In another embodiment, the surfactant is present at a concentration of no greater than 3%. In another embodiment, the surfactant is present at a concentration of no greater than 2.5%.

The composition may further comprise a stabilizing agent for the hydrogen peroxide. If present, the stabilizing agent is present at a concentration in the range from about 0.001% to about 1% by weight of the composition.

The amount of metal removed is in the range from at least 40 μin to about 120 μin. The surface of the metal substrate, following intergranular etching with the inhibitor/surfactant embodiment, is characterized by the presence of intergranular crevices and steep-sided ridges and valleys, when examined by electron microscope.

In one embodiment (WO 99/40764), referred to herein as the "heterocyclic/adhesive" embodiment, the process includes a step of intergranular etching which is carried out with an intergranular etching composition comprising (a) hydrogen peroxide;
(b) at least one acid;
(c) at least one nitrogen-containing, five-membered heterocyclic compound which does not contain any sulphur, selenium or tellurium atom in the heterocycle; and
(d) at least one adhesive compound from the group consisting of sulfinic acids, seleninic acids, tellurinic acids, heterocyclic compounds containing at least one sulphur, selenium and/or tellurium atom in the heterocycle, and sulfonium, selenonium and telluronium salts having the general formula (I),

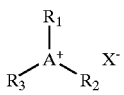 (I)

in which
A stands for S, Se or Te;
$R_1$, $R_2$ and $R_3$ stand for alkyl, substituted alkyl, alkenyl, phenyl, substituted phenyl, benzyl, cycloalkyl, substituted cycloalkyl, $R_1$, $R_2$ and $R_3$ being the same or different; and
$X^-$ stands for an anion of an inorganic or organic acid or hydroxide, provided that the acid selected to constitute component (b) is not identical to the sulfinic, seleninic or tellurinic acids selected as component (d).

In one embodiment of the heterocyclic/adhesive intergranular etching composition, component (c) comprises one or more nitrogen containing heterocyclic compounds selected from triazoles, tetrazoles, imidazoles, pyrazoles and purines.

In one embodiment of the heterocyclic/adhesive intergranular etching composition, component (d) is a sulfinic acid selected from aromatic sulfinic acids and compounds having the formula:

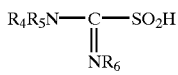

wherein $R_4$, $R_5$ and $R_6$=H, alkyl, substituted alkyl, phenyl, substituted phenyl, $R_7$—(CO)— with $R_7$=H, alkyl, substituted alkyl, phenyl, substituted phenyl, wherein $R_4$, $R_5$ and $R_6$ may be the same or different.

In one embodiment, component (d) is formamidine sulfinic acid.

In one embodiment of the heterocyclic/adhesive intergranular etching composition, component (d) comprises one or more heterocyclic compounds selected from thiophenes, thiazoles, isothiazoles, thiadiazoles and thiatriazoles. In another embodiment, component (d) comprises one or more sulfinic acid compounds selected from benzene sulfinic acid, toluene sulfinic acid, chlorobenzene sulfinic acid, nitrobenzene sulfinic acid and carboxybenzene sulfinic acid. In another embodiment, component (d) comprises one or more sulfonium salts selected from trimethyl sulfonium salts, triphenyl sulfonium salts, methioninealkyl sulfonium salts, and methionine benzylsulfonium salts.

In one embodiment of the heterocyclic/adhesive intergranular etching composition, component (d) is a thiophene compound having the chemical formula:

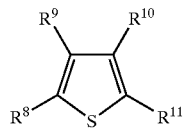

wherein $R^8$, $R^9$, $R^{10}$ and $R^{11}$ may be hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R^{12}$—CONH— wherein $R^{12}$ may be hydrogen, alkyl, substituted alkyl, phenyl, substituted phenyl, whereby $R^8$, $R^9$, $R^{10}$ and $R^{11}$ may be the same or different, or wherein two or more of $R^8$, $R^9$, $R^{10}$ and $R^{11}$ may be combined to form homo- or heterocyclic rings condensed with the thiophene ring.

In one embodiment, the thiophene is an aminothiophenecarboxylic acid, ester or amide. In another embodiment, the thiophene is 3-aminothiophene-2-carboxylate methyl ester.

In one embodiment of the heterocyclic/adesive intergranular etching composition component (d) is a thiazote of the chemical formula:

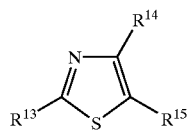

wherein $R^{13}$, $R^{14}$ and $R^{15}$ may be hydrogen, alkyl, substituted alkyl, phenyl, substituted phenyl, halogen, amino, alkylamino, dialkylamino, hydroxy, alkoxy, carboxy, carboxyalkyl, alkoxycarbonyl, aminocarbonyl, $R^{12}$—CONH— wherein $R^{12}$ may be as defined above, whereby $R^{13}$, $R^{14}$ and $R^{15}$ may be the same or different, or in which two or more of $R^{13}$, $R^{14}$ and $R^{15}$ may be combined to form homo- or heterocyclic rings condensed with the thiazole ring.

In one embodiment, the thiazole is an aminothiazole or a substituted aminothiazole. In addition, the compounds of component (d) may be thiadiazoles substituted with the same R groups as above. In one embodiment, the thiadiazole is an aminothiadiazole or a substituted aminothiadiazole.

In one embodiment of the heterocyclic/adhesive intergranular etching composition, component (c) is a triazole of the chemical formula:

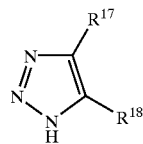

wherein $R_{17}$ and $R_{18}$ may be hydrogen, alkyl, substituted alkyl, phenyl, substituted phenyl, amino, carboxyalkyl, and whereby $R^{17}$ and $R^{18}$ may be the same or different, or in which $R^{17}$ and $R^{18}$ may be combined to form homo- or heterocyclic rings condensed with the triazole ring.

In one embodiment of the heterocyclic/adhesive intergranular etching composition, component (c) is a tetrazole of the chemical formula:

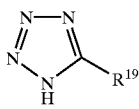

wherein $R^{19}$ may be hydrogen, alkyl, substituted alkyl, phenyl, substituted phenyl, haloalkyl, amino, benzyl, carboxy, carboxyalkyl, alkoxycarbonyl, aminocarbonyl, $R^{12}$—CONH— wherein $R_{12}$ may be as defined above.

In one embodiment, the tetrazole is 5-aminotetrazole. In another embodiment, the tetrazole is 5-phenyltetrazole.

In one embodiment, component (c) includes an imidazole compound. In another embodiment, the imidazole is benzimidazole.

Preferred embodiments of component (c) are 5-phenyltetrazole, benzotriazole, methylbenzotriazole and ethylbenzotriazole. In one embodiment, the intergranular etching composition of the heterocyclic/adhesive embodiment includes a combination of a nitrogen-containing heterocyclic compound, such as benzotriazole, methylbenzotriazole, ethylbenzotriazole, 5-aminotetrazole or 5-phenyltetrazole, as component (c), with heterocyclic compounds such as aminothiophencarboxylic acids, their esters or amides, aminothiazolenes and substituted aminothiazolenes, as component (d).

The components of the heterocyclic/inhibitor embodiment of the intergranular etching composition, when present, are preferably present in the following concentration ranges:

| | |
|---|---|
| Sulfuric acid, concentrated: | 10 to 250 g/l |
| Hydrogen peroxide, 30 wt % solution: | 1 to 100 g/l |
| 5-membered nitrogen-containing heterocyclic compound: | 0.5 to 50 g/l |
| Adhesive compounds containing sulfinic, selenic or telluric acids: | 0.05 to 10 g/l |
| Adhesive heterocyclic compounds: | 0.05 to 20 g/l |
| Sulfonium, Selenonium or Telluronium salts | 0.01 to 10 g/l |

The treatment temperature is in the range from about 20° C. to about 60° C., and the treatment time is in the range from about 10 to about 600 seconds. In one embodiment, the treatment temperature is in the range from about 35° C. to about 45° C. In another embodiment, the treatment time is in the range from about 20 to about 90 seconds. Generally, the higher the temperature, the less time is required for the intergranular etching process.

The amount of metal removed is in the range from at least 40 μin to about 120 μin. The surface of the metal substrate, following intergranular etching with the heterocyclic/adhesive embodiment, is characterized by the presence of intergranular crevices and steep-sided ridges and valleys, when examined by electron microscope.

In one embodiment described in U.S. Pat. No. 6,086,779, referred to herein as the "metal/redox/oxygen" embodiment, the intergranular etching composition comprises (a) an acid, (b) a copper complexing agent, (c) a metal capable of having a multiplicity of oxidation states which is present in one of its higher positive oxidation states and which metal forms a composition soluble salt, and (d) oxygen.

In one embodiment of the metal/redox/oxygen intergranular etching composition, the concentration of the higher positive oxidation state metal in the composition is greater than about 4 grams per liter of composition. In another embodiment, the concentration of the higher positive oxidation state metal is in the range from about 3 to about 6 g/l.

The acid which is included in the metal/redox/oxygen intergranular etching composition may be any acid or mixture of acids which is strong enough to intergranular etch the copper or copper alloy in the presence of the other ingredients in the composition. The compositions generally will contain from about 20 to about 400 grams of acid, preferably from about 50 to about 150 grams of acid per liter of composition. Sufficient acid should be present in the composition to provide a pH of from 0 to about 6, or more often, from about 0 to about 3.

The acid utilized in the compositions of the metal/redox/oxygen intergranular etching composition may be mineral acids, organic acids or mixtures thereof. Examples of mineral acids include sulfuric acid, perchloric acid, hydrochloric acid, fluoroboric acid, phosphoric acid, etc. Sulfuric acid is a particularly preferred mineral acid. Examples of organic acids which may be utilized include carboxylic acids such as acetic acid, alkane sulfonic acids, alkanol sulfonic acids, or mixtures thereof.

The alkane sulfonic acids may be represented by the following formula, R—SO$_3$H, wherein R is an alkyl group containing from about 1 to about 18, or from about 1 to about 12 carbon atoms. Examples of alkane sulfonic acids include methane sulfonic acid, ethane sulfonic acid, propane sulfonic acid, butane sulfonic acid, pentane sulfonic acid, hexane sulfonic acid, decane sulfonic acid and dodecane sulfonic acid.

The alkanol sulfonic acids may be represented by the following formula: $(C_nH_{2n+1})$—CH(OH)—$(CH_2)_m$—SO$_3$H wherein n is from 0 to about 10, m is from 1 to about 11 and the sum of m+n is from 1 up to about 12. The hydroxy group of the alkanol sulfonic acids may be a terminal or internal hydroxy group. Examples of useful alkanol sulfonic acids include hydroxyethyl sulfonic acid, hydroxypropyl sulfonic acid, hydroxybutyl sulfonic acid, hydroxypentyl sulfonic acid, hydroxyhexyl sulfonic acid, and hydroxydodecyl sulfonic acid.

A second component of the compositions of the metal/redox/oxygen embodiment is at least one complexing agent selected from urea and thiourea compounds, amidines, and imidazole thiones. Specific examples of urea compounds include urea, urea nitrate, urea oxalate, 1-acetylurea, 1-benzylurea, 1-butylurea, 1,1-diethylurea, 1,1-diphenylurea, 1-hydroxyurea, etc. Examples of useful urea compounds are found in Holtzman et al, U.S. Pat. No. 4,657,632, which is incorporated herein by reference for its teachings relating to urea compounds.

The complexing agents may be any of those complexing agents described below in the section on immersion metal plating solutions. The amount of the complexing agent may be varied over a wide range such as from about 5 to about 200 g/l of composition. More often the composition will contain from about 5 to 120 g/l and preferably from about 15 to about 75 g/l. Preferably the complexing agent is thiourea or 1-methyl-3-propyl imidazole-2-thione (PTI).

Another component of the compositions of the metal/redox/oxygen embodiment is one or more metals capable of having a multiplicity of oxidation states, which metal is present in one of its higher positive oxidation states, and which metal forms a composition soluble salt. Examples of such metals include tin, lead, platinum, and palladium which have positive oxidation states of +2 and +4; bismuth and antimony which have positive oxidation states of +3 and +5;

and cerium and titanium which have positive oxidation states of +3 and +4. Particularly preferred examples of higher oxidation state metals useful in the present embodiment include tin (+4), bismuth (+5), lead (+4) and cerium (+4). Tin present as stannic ion (+4) is most preferred.

The compositions of the metal/redox/oxygen embodiment containing one or more of the above described metals in the higher positive oxidation state can be prepared, for example, by dissolving a metal oxide or sulfate wherein the metal in the metal oxide or sulfate is in its higher positive oxidation state in the composition. For example, a composition containing stannic ions can be produced by dissolving a colloidal dispersion of tin (IV) oxide in sulfuric acid and water. Alternatively, tin (IV) sulfate can be used.

The compositions of the metal/redox/oxygen embodiment preferably contain more than 4 grams per liter of the metal in the higher oxidation state. As the intergranular etching process proceeds, stannic ion is reduced to stannous ion, and the copper that is removed from the copper substrate is incorporated into the composition as a copper complex formed by reaction of the dissolved cupric ions and the copper complexing agent present in the composition. The stannous ion is reconverted to stannic ion by oxidation with oxygen from air.

Another component of the compositions of the metal/redox/oxygen embodiment is dissolved oxygen or air. Typically, the amount of oxygen present in a composition will range from about 1 to about 15 mg per liter of composition, more often, from about 5 to about 9 mg per liter of composition. The amount of dissolved oxygen in the composition should be an amount sufficient to oxidize at least part of the metal present in the composition in its lower positive oxidation state to a higher positive oxidation state; for example, to oxidize stannous ion to stannic ion.

In one preferred embodiment of the metal/redox/oxygen embodiment, oxygen or air is used as the exclusive oxidizing agent, and the composition is free of other typical oxidizing agents such as peroxides, persulfates, peroxysulfates, permanganates, chromic acid, and metals other than those specifically identified above.

In one embodiment, the amount of oxygen present in the composition is sufficient to maintain the concentration of stannous ions in the composition to less than about 2 grams per liter of composition by oxidation of the stannous ion to stannic ion. In another embodiment, the concentration of dissolved copper should be maintained below about 2.5 grams of copper per liter of composition. The copper concentration may be reduced by precipitating the copper complex from the spent composition.

The composition of the metal/redox/oxygen embodiment also may include one or more surfactants compatible with each of the metal salts, the acids and the complexing agent. The composition may optionally contain at least one surfactant in a concentration from about 0.01 to about 100 grams per liter of bath and more preferably from about 0.05 to about 20 grams per liter of bath. The surfactant may be at least one surfactant including amphoteric, nonionic, cationic, or anionic surfactants; or mixtures thereof. The nonionic surfactants are preferred. The surfactants which may be optionally included in this embodiment are those disclosed below in the section on surfactants which may optionally be included in the immersion metal plating solution.

The following examples illustrate the preparation of the compositions of the metal/redox/oxygen embodiment.

EXAMPLE 1

A composition containing 10 grams of stannic ion per liter of composition is produced by dissolving 83 grams per liter of a 15% tin (IV) oxide colloidal dispersion (purchased from Alfa Aesar, product code 40026), 60 grams of thiourea per liter of composition, 100 grams of sulfuric acid per liter of composition, and water. Oxygen is dissolved in the composition by bubbling oxygen through the mixture.

EXAMPLE 2

The procedure of Example 1 is repeated except that an equivalent amount of 1-methyl-3-propyl-imidazole-2-thione (PTI) is substituted for the thiourea.

EXAMPLE 3

The procedure of Example 1 is repeated except that the sulfuric acid is replaced by an equivalent amount of methane sulfonic acid.

EXAMPLE 4

The procedure of Example 1 is repeated except that the sulfuric acid is replaced by an equivalent amount of acetic acid.

EXAMPLE 5

The procedure of Example 1 is repeated except that the sulfuric acid is replaced by an equivalent amount of hydrochloric acid.

EXAMPLE 6

The procedure of Example 1 is repeated except that the tin (IV) is replaced by an equivalent amount of bismuth (V).

The amount of metal removed is in the range from at least 40 $\mu$in to about 120 $\mu$in, calculated as described above. In one embodiment, the amount of metal removed is about 80 $\mu$in, calculated as described above. The surface of the metal substrate, following intergranular etching with the metal/redox/oxygen embodiment, is characterized by the presence of intergranular crevices and steep-sided ridges and valleys, when examined by electron microscope.

The processing conditions of the various embodiments of the intergranular etching step may be suitably selected to yield the optimum intergranular etched surface of the metal substrate, based on the particular metal substrate, i.e., copper, a copper alloy, aluminum, zinc, etc. Generally, however, the intergranular etching steps should be carried out at a process temperature in the range from about 25° C. to about 75° C., for a period of from about 1 minute to about 100 minutes, at atmospheric pressure.

The amount of metal removed is calculated based on the weight of metal removed from a test panel. This calculated value is expressed as an average thickness of metal removed, based on the theoretical approximation that, on average for a large area, the metal is evenly removed from the surface of the metal substrate.

Etch depth in both microetched and intergranular etched foils is calculated as follows. A panel of copper foil is cut in a square of exactly 3 in.×3 in. This foil is weighed, the entire foil (both sides) is subjected to the respective microetch or intergranular etch process, the foil is rinsed and dried, and then is reweighed. The etch depth is calculated from the following formula:

$$\text{etch depth (μin)} = \frac{3240 \times \text{weight loss (g)}}{\text{area of panel (in}^2)}$$

As can be observed from the formula, the etch depth is actually averaged over the entire surface area of the foil. Thus, while the etch depth yields a measure of the amount of metal removed from the foil, it does not reflect the topography of the resulting surface. The surface topography is best observed by electron microscope, which reveals significant differences between microetched and intergranular etched surfaces.

The foregoing 'new generation' etching methods herein are referred to as "intergranular etching" processes. Such intergranular etching processes result in a deeply creviced, etched surface in which over 25 microinches, up to about 120 microinches, or more, of metal is removed from the surface of the metal article. A surface which has undergone intergranular etching as defined herein is characterized by the presence of intergranular crevices having an aspect ratio of at least about 1, preferably at least about 2. Aspect ratio is defined as the ratio of crevice depth to crevice width. The crevice depth is obtained by estimating or measuring the distance from the highest point or points adjacent to the crevice, on one or both sides, to the deepest point at the bottom of the crevice. The crevice width is obtained by estimating or measuring the distance between or separating the highest points on either side of the crevice near or adjacent the deepest point at the bottom of the crevice. The deep intergranular crevices produced by the foregoing methods may be from about 0.5 to about 5 microns in width, and may be from about 1 to about 10 microns in depth. In one embodiment, the intergranular crevices have a depth of at least about 1 micron. In one embodiment, the intergranular crevices have a depth of at least about 2 microns. In one embodiment, the intergranular crevices have a width of at least about 1 micron. In one embodiment, the intergranular crevices have a width of at least about 2 microns.

In the embodiments of the intergranular etching process described hereinabove, the intergranular etched surface comprises intergranular crevices having an aspect ratio of at least about 1. In one embodiment, the intergranular etched surface comprises intergranular crevices having an aspect ratio of at least about 2. The aspect ratio may be as high as about 5, or perhaps higher. However, high aspect ratios, in order to be most effective to enhance adhesion of the laminating materials to be subsequently applied, should be coupled with an increasing intergranular width. A laminating material applied to the intergranular etched metal surface usually cannot effectively penetrate into intergranular crevices having high aspect ratios unless the width of the crevice is about 0.5 micron or greater, when the depth of the crevice is in an aspect ratio of depth to width of about 1:1 or greater. Thus, past a certain point, further increases in aspect ratio are of no further benefit in improving adhesion. Similarly, the width of the intergranular etched crevices is preferably in the range from about 0.5 micron to about 5 microns, coupled with an aspect ratio in the range from about 1 to about 5, in order to provide optimum contact with and adhesion to non-conductive polymeric materials.

In one embodiment, the intergranular etched surface comprises intergranular crevices having a depth of at least about 1 micron. In one embodiment, the intergranular etched surface comprises intergranular crevices having a depth of at least about 2 microns. In one embodiment, the intergranular etched surface comprises intergranular crevices having a depth of about 2 microns. In one embodiment, the intergranular etched surface comprises intergranular crevices having a depth of at least about 5 microns.

In one embodiment, the intergranular etched surface comprises intergranular crevices having a depth of at least about 1 micron coupled with an aspect ratio of at least 1. In one embodiment, the intergranular etched surface comprises intergranular crevices having a depth of at least about 2 microns coupled with an aspect ratio of at least about 2. In one embodiment, the intergranular etched surface comprises intergranular crevices having a depth of about 2 microns coupled with an aspect ratio of at least about 1. In one embodiment, the intergranular etched surface comprises intergranular crevices having a depth of at least about 5 microns coupled with an aspect ratio of at least about 1.

Exact determination of aspect ratios of intergranular etched surfaces according to the present invention is difficult, and estimated aspect ratios must often be used. This is due to several reasons. First, the usual methods of measuring surface variations, such as atomic force microscope (AFM), do not have sufficient z-axis (vertical to the plane of the etched metal surface) range to measure the full surface profile, or roughness, of the intergranular etched surfaces resulting from the process of the present invention. Stylus profilometry typically does not employ a stylus sufficiently narrow to penetrate the full depth of the intergranular crevices. These methods may be used to obtain an estimate of the minimum etch depth and aspect ratio, but may underestimate these parameters.

One method for determining aspect ratios on an approximate or empirical basis is to scatter beads of known diameter across the intergranular etched surface, and to compare the size and location of these beads with the features of the intergranular etched surface. Thus, for example, spherical calibrated beads having a diameter of 0.5 μm may be used, and the surface examined by, e.g., SEM. Such beads are available commercially from Electron Microscopy Sciences, Ft. Washington, Pa.

Another method of determining the aspect ratio of an intergranular etched surface is by a digital microanalysis system which can profile surfaces imaged by a pair of, e.g., SEM photomicrographs. Each of the pair of photomicrographs is obtained at a different angle, which creates parallax which can be employed to determine quantitatively the surface profile by anaglyphic techniques of stereo imaging. Stereo anaglyph images may be obtained by an instrument such as a Philips XL 30 ESEM, and thence analyzed using Noran Vantage Digital Microanalysis System (DMS) to calculate the surface profile of the intergranular etched surface.

FIGS. 1–6 are photomicrographs of copper foils taken with a Hitachi S-4500 field emission scanning electron microscope (FE-SEM). The small round objects in FIGS. 1–6 are 0.5 μm spherical calibrated beads placed on the samples to show relative dimensions. Each photomicrograph includes a scale in the lower right corner, in which the full scale spans 2.0 or 3.0 μm as indicated below each scale. Each scale includes 10 subdivisions, each subdivision corresponding to 0.2 or 0.3 μm FIG. 1 is a photomicrograph, at a magnification of 10,000×, depicting the drum, or shiny, side of an electrodeposited copper foil. The scale in FIG. 1 spans 3.0 μm. As shown in FIG. 1, the surface of the foil is relatively smooth, and individual grains of copper metal are visible.

Figure 2:
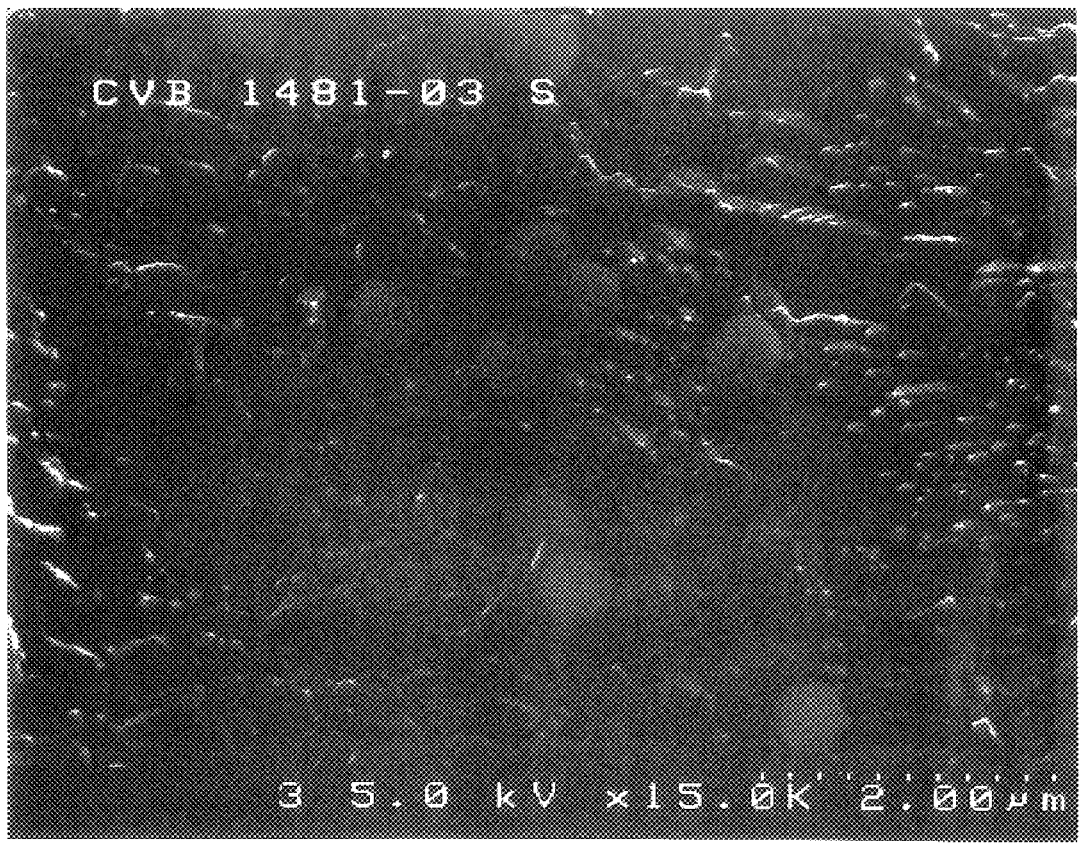
FIG. 2 is a photomicrograph of a copper foil microetched with sulfuric acid/peroxide.
Figure 3:
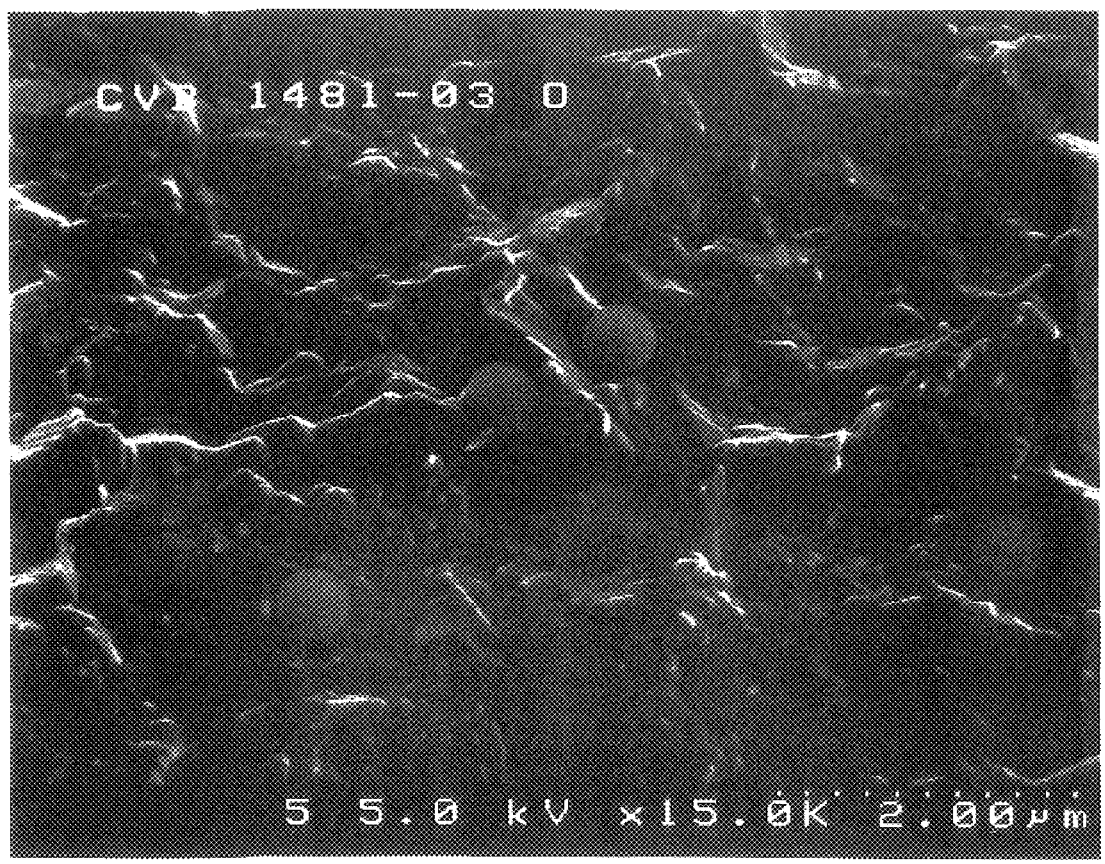
FIG. 3 is a photomicrograph of a copper foil microetched with potassium peroxy monosulfate.

FIGS. 2 and 3 are photomicrographs of foils which have been subjected to microetching processes. FIG. 2 is a photomicrograph, at a magnification of 15,000×, of a copper foil which has been subjected to microetching by a sulfuric acid/hydrogen peroxide solution, comprising about 10% v/v conc. $H_2SO_4$, 3–5% v/v of a 35% solution of $H_2O_2$, and 112 ml/l $CuSO_4$ solution (270 g/l $CuSO_4 \cdot 5H_2O$). The full scale in FIG. 2 spans 2.0 µm. As shown in FIG. 2, this microetching process results in a surface with a few raised peaks and intervening valleys, but no intergranular crevices. As is apparent from a comparison of the 0.5 µm beads with the features of the etched surface shown in FIG. 2, the etched surface shows some roughness and small crevices having aspect ratios of much less than one. When analyzed by DMS, the aspect ratio of the surface shown in FIG. 2 is found to be about 0.25. Thus, the surface is substantially free of intergranular crevices having an aspect ratio of about 1 or greater.

FIG. 3 is a photomicrograph, at a magnification of 15,000×, of a copper foil which has been subjected to microetching by the Oxone® process, in which the foil is microetched by a solution of 120 g/l Du Pont Oxone® (43% potassium peroxymonosulfate, 23% potassium bisulfate, 29% potassium sulfate, 3% potassium peroxydisulfate, 2% magnesium carbonate) and about 5% $H_2SO_4$. The full scale in FIG. 3 spans 2.0 µm. As shown in FIG. 3, this microetching process results in a surface with a few raised peaks and intervening valleys, but no intergranular crevices. As is apparent from a comparison of the 0.5 µm beads with the features of the etched surface shown in FIG. 3, the etched surface shows some roughness and small crevices having aspect ratios of much less than one. When analyzed by DMS, the aspect ratio of the surface shown in FIG. 3 is found to be about 0.3. Thus, the surface is substantially free of intergranular crevices having an aspect ratio of about 1 or greater.

Figure 4:
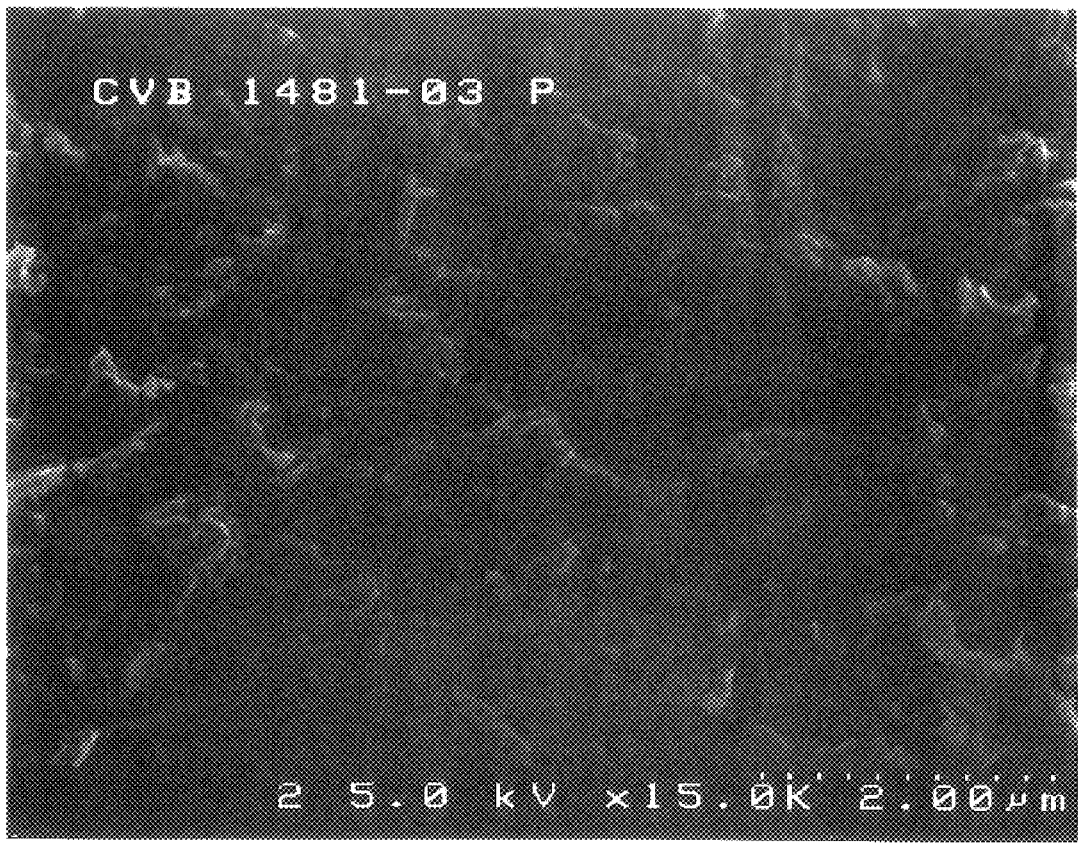
FIG. 4 is a photomicrograph of a copper foil intergranular etched with an intergranular etching composition comprising sulfuric acid, hydrogen peroxide and m-nitrobenzene sulfonate, in accordance with the present invention.

FIG. 4 is a photomicrograph, at a magnification of 15,000×, of a copper foil which has been subjected to intergranular etching by an intergranular etching composition comprising about 28 g/l of a solution of 35% hydrogen peroxide, about 75 g/l conc. $H_2SO_4$, about 3 g/l benzotriazole and about 7 g/l of sodium m-nitrobenzene sulfonate. The full scale in FIG. 4 spans 2.0 µm. As shown in FIG. 4, the intergranular etched surface is characterized by the presence of deep crevices between the copper grains, i.e., intergranular crevices, in which the surface includes grains of copper metal separated by dark areas which are the intergranular crevices. The depth of the crevices may exceed 120 µin in a foil which has been intergranular etched so as to remove about 80 µin calculated as discussed above. As is apparent from a comparison of the 0.5 µm beads with the features of the etched surface shown in FIG. 4, the etched surface includes both large and small copper grains, a high degree of irregularity and intergranular crevices having aspect ratios of about 1 or greater. The 0.5 µm beads may be contained within the intergranular crevices, thus revealing an aspect ratio of at least about 1. In some embodiments of the intergranular crevices, more than one 0.5 µm bead may be contained within the crevice, one bead above the other, thereby revealing an aspect ratio of at least about 2. It is noted that, due to the depth and narrowness of the intergranular crevices, and the diameter of the beads, the beads in some embodiments can not touch the bottom of the intergranular crevices. In such an embodiment, the aspect ratio may exceed 2, or the aspect ratio may exceed 5. When analyzed by DMS, the intergranular etched surface shown in FIG. 4 is found to include intergranular crevices having an aspect ratio of about 25.

Figure 5:
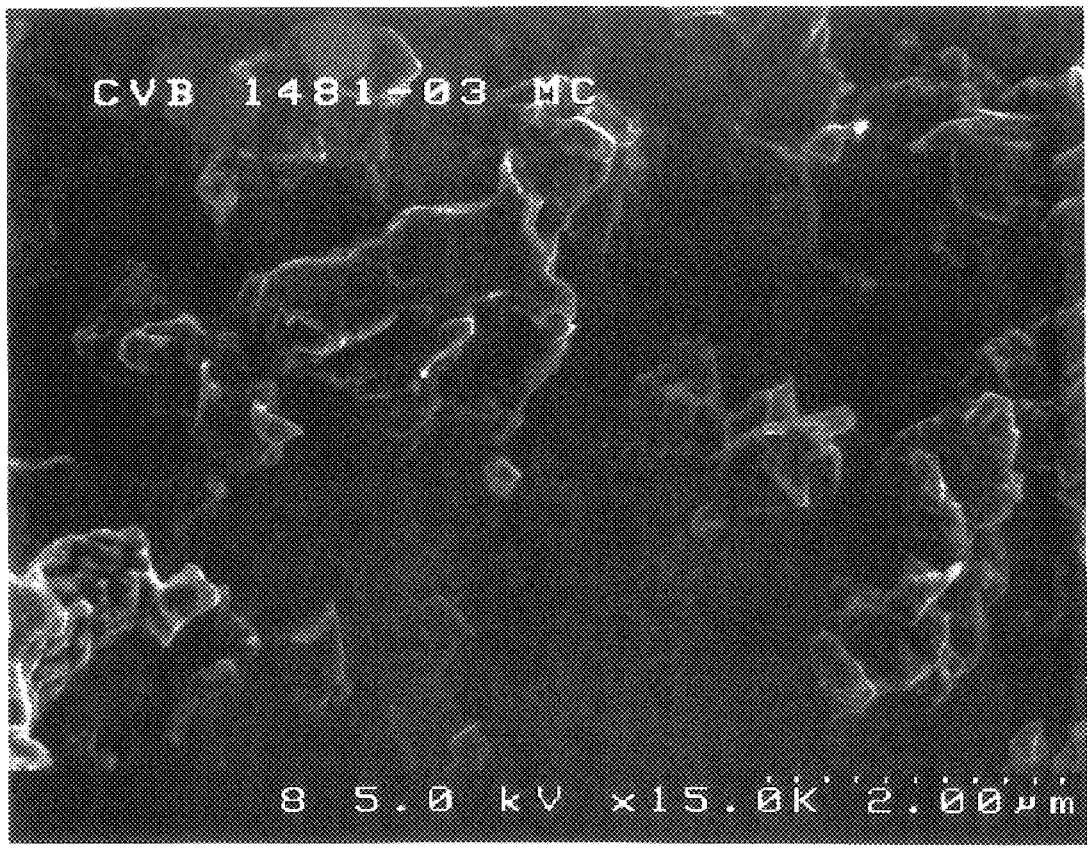
FIG. 5 is a photomicrograph of a copper foil intergranular etched with an intergranular etching composition comprising sulfuric acid, hydrogen peroxide, benzotriazole and sodium chloride, in accordance with the present invention.

FIG. 5 is a photomicrograph, at a magnification of 15,000×, of a copper foil which has been subjected to intergranular etching by an intergranular etching composition comprising about 5% v/v conc. sulfuric acid, about 7% v/v of a 35% solution of hydrogen peroxide, about 5 g/l benzotriazole and 80 mg/l NaCl. The full scale in FIG. 5 spans 2.0 µm. As shown in FIG. 5, the intergranular etched surface is characterized by the presence of deep crevices between the metal grains, i.e., intergranular crevices, in which the surface includes grains of metal separated by dark areas which are the intergranular crevices. The depth of the crevices may exceed 120 µin in a foil which has been intergranular etched so as to remove about 80 µin calculated as discussed above. As is apparent from a comparison of the 0.5 µm beads with the features of the etched surface shown in FIG. 5, the etched surface includes large copper grains, a high degree of irregularity and intergranular crevices having aspect ratios greater than 1. The 0.5 µm beads may be contained within the intergranular crevices, thus revealing an aspect ratio of at least about 1. In one embodiment of the intergranular crevice, more than one 0.5 µm bead may be contained within the crevice, one bead above the other, thereby revealing an aspect ratio of about 5 or greater. It is noted that, due to the depth and narrowness of the intergranular crevices, and the diameter of the beads, in FIG. 5, the beads in some embodiments can not touch the bottom of the intergranular crevices. In such an embodiment, the aspect ratio may exceed 10, and in one embodiment the aspect ratio may be 20 or more. When analyzed by DMS, the intergranular etched surface shown in FIG. 5 is found to include intergranular crevices having an aspect ratio of about 25.

Figure 6:
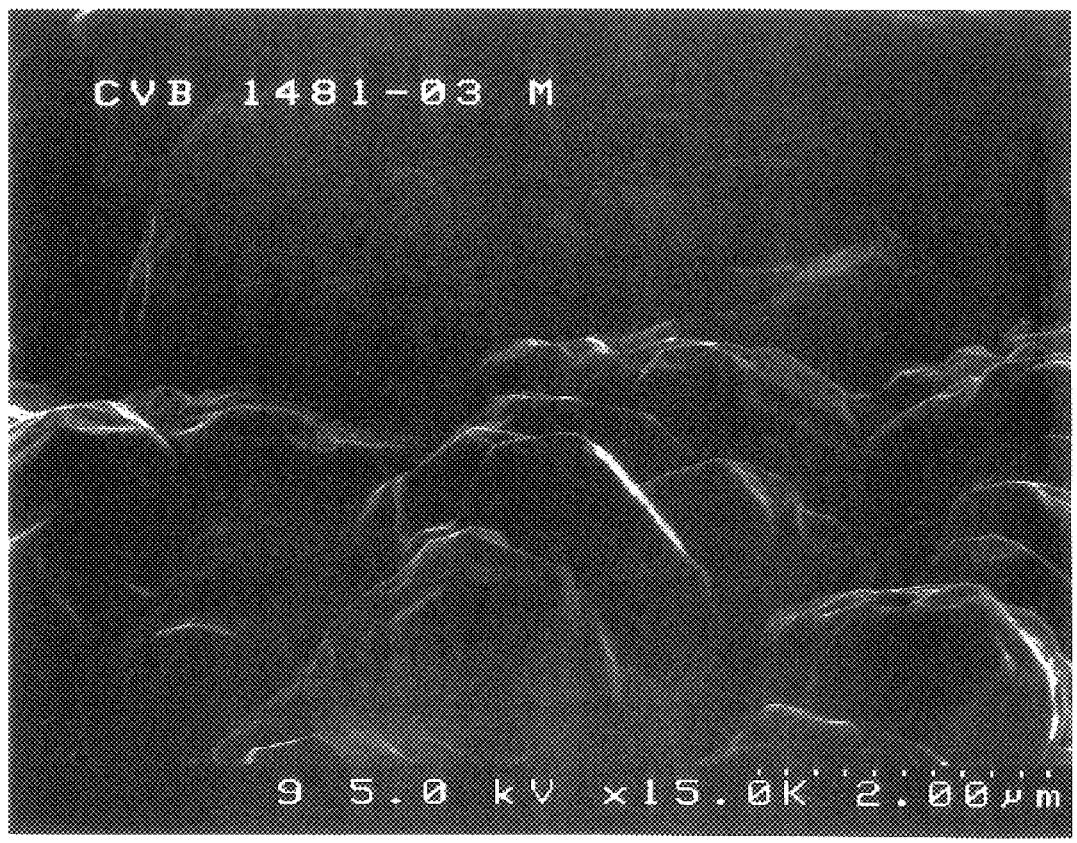
FIG. 6 is a photomicrograph of a copper foil intergranular etched with an intergranular etching composition comprising cupric chloride, formic acid and ammonium chloride, in accordance with the present invention.

FIG. 6 is a photomicrograph, at a magnification of 15,000×, of a copper foil which has been subjected to intergranular etching by an intergranular etching composition comprising cupric chloride dihydrate 50 g/l, formic acid 20 g/l and ammonium chloride 80 g/l. The full scale in FIG. 6 spans 2.0 µm. As shown in FIG. 6, the intergranular etched surface is characterized by the presence of deep crevices between very large metal grains, i.e., intergranular crevices, in which the surface includes large grains of metal separated by the intergranular crevices. The depth of the crevices may exceed 120 µin in a foil which has been intergranular etched so as to remove about 80 µin calculated as discussed above. As is apparent from a comparison of the 0.5 µm beads with the features of the etched surface shown in FIG. 6, the etched surface includes very large copper grains, a high degree of irregularity and intergranular crevices having aspect ratios of at least about 1. The 0.5 µm beads may be contained within the intergranular crevices, thus revealing an aspect ratio of at least about 1. In some embodiments of the intergranular crevices, more than one 0.5 µm bead may be contained within the crevices, one bead above the other, thereby revealing an aspect ratio of about 2 or greater. It is noted that, due to the depth and narrowness of the intergranular crevices, and the diameter of the beads, the beads in some embodiments can not touch the bottom of the intergranular crevices. In such an embodiment, the aspect ratio may exceed 2. When analyzed by DMS, the intergranular etched surface shown in FIG. 6 is found to include intergranular crevices having an aspect ratio of about 2–3.

In order to quantitatively estimate the extent of intergranular etching, some measure of the number of crevices per unit area is helpful. One method of determining the number is to divide the intergranular etched surface into a grid of square areas having 10 µm on each side, and thence to count the number of intergranular crevices in each square, or to count the number of squares in which at least one intergranular crevice is found. More particularly, the number of squares in which at least one intergranular crevice having a selected aspect ratio may be determined.

Thus, in one embodiment, when the intergranular etched surface is divided into a grid of squares 10 microns on each side, at least 50% of the squares include at least one intergranular crevice having an aspect ratio of at least 1. In one embodiment, at least 75% of the squares include at least one intergranular crevice having an aspect ratio of at least 1. In one embodiment, at least 90% of the squares include at least one intergranular crevice having an aspect ratio of at least 1. In one embodiment, at least 50% of the squares include at least one intergranular crevice having an aspect ratio of at least 2. In one embodiment, at least 50% of the squares include at least one intergranular crevice having an aspect ratio of at least 5. In one embodiment, at least 75% of the squares include at least one intergranular crevice having an aspect ratio of at least 2. In one embodiment, at least 90% of the squares include at least one intergranular crevice having an aspect ratio of at least 2. In one embodiment, at least 95% of the squares include at least one intergranular crevice having an aspect ratio of at least 1. In one embodiment, at least 95% of the squares include at least one intergranular crevice having an aspect ratio of at least 2.

Thus, in one embodiment, when the intergranular etched surface is divided into a grid of squares 10 microns on each side, at least 50% of the squares include at least one intergranular crevice having an aspect ratio of at least 1 coupled with a depth of at least about 1 micron. In one embodiment, at least 75% of the squares include at least one intergranular crevice having an aspect ratio of at least 1 coupled with a depth of at least about 1 micron. In one embodiment, at least 90% of the squares include at least one intergranular crevice having an aspect ratio of at least 1 coupled with a depth of at least about 1 micron. In one embodiment, at least 50% of the squares include at least one intergranular crevice having an aspect ratio of at least 2 coupled with a depth of at least about 1 micron. In one embodiment, at least 50% of the squares include at least one intergranular crevice having an aspect ratio of at least 5 coupled with a depth of at least about 1 micron. In one embodiment, at least 75% of the squares include at least one intergranular crevice having an aspect ratio of at least 2 coupled with a depth of at least about 1 micron. In one embodiment, at least 90% of the squares include at least one intergranular crevice having an aspect ratio of at least 2 coupled with a depth of at least about 1 micron. In one embodiment, at least 95% of the squares include at least one intergranular crevice having an aspect ratio of at least 1 coupled with a depth of at least about 1 micron. In one embodiment, at least 95% of the squares include at least one intergranular crevice having an aspect ratio of at least 2 coupled with a depth of at least about 1 micron.

(B) Immersion Plating

The step of intergranular etching the surface of the metal substrate, as described above, is followed by a step of applying an immersion plated metal to the intergranular etched surface by immersing the surface in an immersion plating composition.

In one embodiment of the immersion plating step, one or more plating metals selected from tin, silver, bismuth, copper, nickel, lead, zinc, indium, palladium, platinum, gold, cadmium, ruthenium, cobalt, gallium and germanium, and alloys of these metals, may be deposited onto the intergranular etched surface by immersing the surface in an aqueous immersion metal plating composition which comprises (A) at least one solution-soluble metal compound or metal salt selected from one or more plating metals selected from tin, silver, bismuth, copper, nickel, lead, zinc, indium, palladium, platinum, gold, cadmium, ruthenium, cobalt, gallium and germanium and mixtures of two or more thereof. The immersion plating composition may also comprise at least (B) one acid selected from mineral acids, carboxylic acids and hydrocarbyl-substituted sulfonic acids, and mixtures thereof; and (C) a complexing agent.

The metals may be present in the plating bath as water-soluble compounds or salts including the oxides, nitrates, halides, acetates, fluoborates, fluosilicates, alkane sulfonates, substituted alkyl sulfonates, aryl sulfonates and substituted aryl sulfonates. In one preferred embodiment, the anion of the metal salt corresponds to the anion of the acid used in the plating bath. For example, when fluoboric acid is used as the acid, the salts may be, for example, stannous fluoborate, lead fluoborate, bismuth fluoborate, indium fluoborate, gallium fluoborate or germanium fluoborate. As a further example, when the acid used in the bath is an alkane or an alkanol sulfonic acid, the soluble metal salt may be, for example, tin methane sulfonate, bismuth methane sulfonate, indium methane sulfonate, etc.

The amount of tin, silver, bismuth, copper, nickel, lead, zinc, indium, palladium, platinum, gold, cadmium, ruthenium, cobalt, gallium and germanium, or mixtures of such plating metals, present in the plating solutions of the preferred embodiment may be varied over a wide range such as from about 1 to about 150 grams of metal per liter of solution (g/l). In one embodiment, the range is from about 5 g/l to about 50 g/l. In another embodiment, from about 6 g/l to about 25 g/l. In another embodiment, from about 10 g/l to about 75 g/l. In another embodiment, from about 10 g/l to about 40 g/l. Higher levels of metal may be included in the plating solutions, but economics suggest that the metal levels should be maintained at relatively lower levels.

A second component of the immersion plating compositions of this embodiment is (B) at least one acid selected from mineral acids, carboxylic acids and hydrocarbyl sulfonic acids, and mixtures thereof. The amount of acid contained in the compositions may vary from about 20 g/l to about 500 g/l. In another embodiment, the compositions will contain the acid from about 80 g/l to about 150 g/l. Sufficient acid is present in the compositions to provide the solution with a pH from about 0 to about 3, more often a pH from about 0 to about 2. Generally, it is desirable to use an acid that has an anion common to the acid salts of the metals, in embodiments which include a metal salt.

Examples of useful acids include sulfuric acid, perchloric acid, hydrochloric acid, fluoroboric acid, phosphoric acid, alkylphosphoric, arylphosphoric, alkylsulfuric, arylsulfuric, sulfamic, methylsulfamic, nitric, hydrochloric, hydrobromic, sulfonated dihydroxydiphenylsulfone, methylenediphosphonic acid, boric, thiocyanic, phosphonoformic, phosphonoacetic, carbamic, carbonic and sulfonic acids.

The carboxylic acids include, e.g., formic, acetic, propionic, acrylic, methacrylic, benzoic, and citric; and may also include dicarboxylic acids such as oxalic, maleic, glutaric, and malonic.

The term "hydrocarbyl-substituted sulfonic acids" as used herein is defined to include alkane sulfonic acids, substituted alkyl sulfonic acids, aryl sulfonic acids and substituted aryl sulfonic acids. The substitutions may include one or more substituents selected from hydroxy, nitro, halide, amino, amido or alkoxy groups.

The alkane sulfonic acids which are useful in the preferred embodiment as the anion of the metal salts or as the acid component may be represented by the following formula (II):

$$R-SO_3H \tag{II}$$

wherein R is an alkyl group containing from 1 to about 12 carbon atoms and more preferably, from 1 to about 6 carbon atoms. Examples of such alkane sulfonic acids include, for example, methane sulfonic acid, ethane sulfonic acid, propane sulfonic acid, 2-propane sulfonic acid, butane sulfonic acid, 2-butane sulfonic acid, pentane sulfonic acid, hexane sulfonic acid, decane sulfonic acid and dodecane sulfonic acid. Metal salts, such as salts of tin, bismuth, indium, gallium, germanium and mixtures of two or more thereof, of the individual alkane sulfonic acids or mixtures of any of the above alkane sulfonic acids can be utilized.

In one embodiment, the substituted alkane sulfonic acid is an alkanol sulfonic acid. The alkanol sulfonic acids may be represented by the following formula (III):

$$(C_nH_{2n+1})-CH(OH)-(CH_2)_m-SO_3H \qquad (III)$$

wherein n is from 0 to about 10, m is from 1 to about 11 and the sum of m+n is from 1 up to about 12. The hydroxy group of the alkanol sulfonic acids may be a terminal or internal hydroxy group. Examples of useful alkanol sulfonic acids include 2-hydroxyethyl-1-sulfonic acid, 1-hydroxypropyl-2-sulfonic acid, 2-hydroxypropyl-1-sulfonic acid, 3-hydroxypropyl-1-sulfonic acid, 2-hydroxybutyl-1-sulfonic acid, 4-hydroxybutyl-1-sulfonic acid, 2-hydroxypentyl-1-sulfonic acid, 4-hydroxypentyl-1-sulfonic acid, 2-hydroxyhexyl-1-sulfonic acid, 2-hydroxydecyl-1-sulfonic acid, 2-hydroxy dodecyl-1-sulfonic acid.

The substituted alkane sulfonic acids may include alkyl groups substituted with combinations of halo, alkyl, hydroxy, carboxy, alkoxy, and acetamido groups.

The alkane sulfonic acids and substituted alkyl sulfonic acids such as alkanol sulfonic acids are available commercially and can also be prepared by a variety of methods known in the art.

The aryl sulfonic acids and substituted aryl sulfonic acids may include xylene sulfonic acid, toluene sulfonic acid, benzene sulfonic acid, cumene sulfonic acid, dodecylbenzene sulfonic acid, dodecyl diphenyloxide disulfonic acid, naphthalene sulfonic acid, benzaldehyde sulfonic acid, methylnaphthalene sulfonic acid, trimethylbenzenesulfonic acid, aminobenzene sulfonic acid, halobenzenesulfonic acid, alkoxybenzenesulfonic acid, benzophenone sulfonic acid, benzophenone disulfonic acid, halonaphthalene sulfonic acid, alkylnaphthalene sulfonic acid, alkoxynaphthalene sulfonic acid, carboxybenzene sulfonic acid (3-sulfobenzoic acid), hydroxybenzenesulfonic acid, hydroxynapthalene-sulfonic acid, carboxymethylbenzene sulfonic acid, alkylbenzene disulfonic acid, dicarboxybenzene sulfonic acid, acetamidobenzene sulfonic acid, acetaminonaphthalene sulfonic acid, naphthalene disulfonic acid, alkyl naphthalene disulfonic acid, dialkylbenzene disulfonic acid, biphenyl-4, 4'-disulfonic acid, benzene and naphthalene sulfonic acids that contain combinations of halo, alkyl, hydroxy, carboxy, alkoxy, and acetamino groups.

In one embodiment, the complexing agent is thiourea, structure (IV):

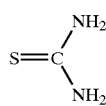

(IV)

In other embodiments, the complexing agent may be a thiourea compound. Thiourea compounds include those disclosed in U.S. Pat. No. 4,715,894, which is incorporated herein by reference. Suitable thiourea compounds comprise thiourea and the various art known derivatives, homologs, or analogs thereof.

In one embodiment, the complexing agent (C) is an imidazole-2-thione compound of the formula (V)

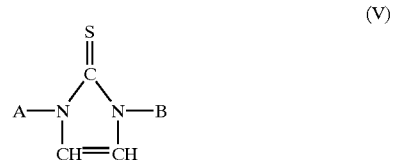

(V)

wherein A and B are the same or different —RY groups, wherein R is a linear, branched or cyclic hydrocarbylene group containing up to about 12 carbon atoms, and Y is a hydrogen, halogen, cyano, vinyl, phenyl, or ether moiety; and (D) water. Further details relating to this complexing agent are provided below.

In one embodiment, the complexing agent is a 1,3-dialkylimidazole-2-thione compound (where A and B are each individually alkyl or cycloalkyl groups), and the thione compound may be unsymmetrical (A and B are different) or symmetrical (A and B are the same). Preferably, the complexing agents are unsymmetrical such as where A is methyl or ethyl and B is an alkyl or cycloalkyl group containing from 3 to 6 carbon atoms. Preferably, when A is methyl, B is a $C_3$–$C_6$ alkyl or cycloalkyl group, and when A is ethyl, B is a $C_4$–$C_6$ alkyl or cycloalkyl group. An example of an unsymmetrical compound is 1-methyl-3-propylimidazole-2-thione.

Alternatively, symmetrical 1,3-dialkylimidazole-2-thione compounds may be utilized in the immersion plating compositions and the dialkyl groups are the same alkyl or cycloalkyl groups containing from 1 to 6 carbon atoms. An example of this class of complexing agents is 1,3-dimethylimidazole-2-thione.

In other embodiments, compounds that may be employed as the complexing agents (C) comprise 2,4-dithiobiuret; 2,4,6-trithiotriuret; alkoxy ethers of isothiourea; thiocyanuric acid; thioammelide (trimer of thiourea); monoalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or di-substituted thioureas such as naphthyl thiourea, diphenyl thiourea, cyclohexyl thiourea and the like, where the cyclic hydrocarbon has up to about ten carbon atoms; the disulfide of thiourea; thio-imidol (the reaction product of thiourea and sodium hydroxide); thiocarbamic acid esters (the reaction products of thiourea and an alcohol comprising a saturated or unsaturated aliphatic or cyclic group having up to about ten carbon atoms); the oligomers of thiourea and formaldehyde, e.g., monomethylol, dimethylol, and trimethylol thioureas; S-alkyl pseudo thioureas (manufactured by the reaction of thiourea with an iodo-lower alkane such as iodomethane where the lower alkyl group contains up to about five carbon atoms; thiocarbonic acid esters of thiourea and an alcohol comprising (a) a saturated or unsaturated aliphatic group having up to about 6 carbon atoms; (b) aryl, aralkyl, or alkaryl group having up to about 12 carbon atoms; or (c) cycloalkyl, cycloalkylalkyl, or alkylcycloalkyl having up to about 12 carbon atoms, and especially where the alcohol is a lower alkyl alcohol; thioureadioxide (also known a formamidinesulfinic acid [C.A. Reg. No. 1758-73-2]); the reaction product of a saturated or unsaturated aliphatic or cyclic organic acid having up to about 12 carbon atoms and especially the lower aliphatic monocarboxylic acid reaction products with thiourea, e.g., acylthioureas, and the mineral acid salts of thiourea, e.g., thiourea mono- or di-sulfate.

The amount of complexing agents included in the immersion plating compositions of the present invention may range from about 5 g/l up to the solubility limit of the complexing agent in the solution. Generally, the solution will contain the complexing agent in an amount from about 25 g/l to about 150 g/l. In one embodiment, the complexing agent is present in an amount from about 50 g/l to about 140 g/l. In another embodiment, the complexing agent is present in an amount from about 80 g/l to about 120 g/l. In another embodiment, the complexing agent is thiourea, which is present in an amount of about 100 g/l. In another embodiment, the complexing agent is thiourea, which is present in an amount of about 125 g/l. In another embodiment, the complexing agent is 1-methyl-3-propyl-imidazole-2-thione, which is present in an amount of about 80 g/l. When the solubility of the complexing agent is low, a cosolvent may be added to solubilize the complexing agent and thereby enhance its activity in the resulting solution. Suitable cosolvents include water-miscible solvents such as alcohols (e.g., ethanol), glycols (e.g., ethylene glycol), alkoxy alkanols (e.g., 2-butoxy ethanol), ketones (e.g., acetone), aprotic solvents (e.g., dimethylformamide, dimethylsulfoxide, acetonitrile, etc.), etc.

The immersion plating compositions of the present invention may also contain one or more chelating agents useful in keeping the immersion platable metal and/or displaced metal in solution. The chelating agents which are useful in these compositions generally comprise the various classes of chelating agents and specific compounds disclosed in Kirk-Othmer, Encyclopedia of Chemical Technology, Third Edition, Vol. 5, pp. 339–368. This disclosure is hereby incorporated by reference for its teachings relating to chelating agents. Chelating agents that are especially preferred comprise polyamines, aminocarboxylic acids and hydroxy carboxylic acids. Some aminocarboxylic acids that may be used comprise ethylenediaminetetraacetic acid, hydroxyethyl ethylenediaminetriacetic acid, nitrilotriacetic acid, N-dihydroxyethylglycine, and ethylenebis(hydroxyphenylglycine). Hydroxy carboxylic acids that may be used comprise tartaric acid, citric acid, gluconic acid and 5-sulfosalicylic acid. Other useful chelating agents include polyamines such as ethylene diamine, dimethylglyoxime, diethylenetriamine, etc. The chelating agents may be present in an amount in the range from about 5 g/l to about 50 g/l.

Various secondary reducing agents may be included in the immersion plating compositions of the present invention. The secondary reducing agents may comprise organic aldehydes whether saturated or unsaturated, aliphatic or cyclic, having up to about 10 carbon atoms, borates, hypophosphite salts and hypophosphorous acid. Lower alkyl aldehydes having up to about 6 carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde, erythrose, threose, arabinose and the various position isomers thereof, and glucose and the various position isomers thereof. Glucose has been found to prevent oxidation of the metal salts to a higher oxidation state, e.g., tin (II) ion to tin (IV) ion, but also as a chelating agent and is especially useful for these reasons. Other useful secondary reducing agents include sodium hypophosphite, hypophosphorous acid, dimethylamino borane, and other boranes. The secondary reducing agents may be present in an amount from about 5 g/l to about 110 g/l. In one embodiment, the reducing agent is present in an amount from about 20 g/l to about 60 g/l. In one embodiment, the reducing agent is present in an amount of about 40 g/l.

The immersion plating composition optionally may include one or more surfactants compatible with the solution soluble metal compounds or salts, the acids and the complexing agents. As noted above, the surfactant may be at least one surfactant including amphoteric, nonionic, cationic, or anionic surfactants; or mixtures thereof. More often, the surfactant is at least one cationic or nonionic surfactant; or mixtures thereof. The nonionic surfactants are preferred.

A variety of nonionic surfactants which can be utilized in the present invention are the condensation products of ethylene oxide and/or propylene oxide with compounds containing a hydroxy, mercapto or primary or secondary amino or amido group, or other nitrogen compound containing at least one N-H group. Examples of materials containing hydroxyl groups include alkyl phenols, styrenated phenols, fatty alcohols, fatty acids, polyalkylene glycols, etc. Examples of materials containing amino groups include alkylamines and polyamines, fatty acid amides, etc.

Examples of nonionic surfactants include ether-containing surfactants having the formula VI:

$$R-O-[(CH_2)_nO]_xH \qquad (VI)$$

wherein R is an aryl or alkyl group containing from about 6 to about 20 carbon atoms, n is two or three, and x is an integer between 1 and about 100. Such surfactants are produced generally by treating fatty alcohols or alkyl or alkoxy substituted phenols or naphthols with excess ethylene oxide or propylene oxide. The alkyl carbon chain may contain from about 14 to 24 carbon atoms and may be derived from a long chain fatty alcohol such as oleyl alcohol or stearyl alcohol.

Nonionic polyoxyethylene compounds of this type are described in U.S. Pat. No. 3,855,085. Such polyoxyethylene compounds are available commercially under the general trade designations SURFYNOL® by Air Products and Chemicals, Inc. of Wayne, Pa., under the designation MACOL®, PLURONIC® or TETRONIC® by BASF Wyandotte Corp. of Wyandotte, Mich., and under the designation SURFONIC® by Huntsman Corporation of Houston, Tex. Examples of specific polyoxyethylene condensation products useful in the invention include MACOL® LA-23 which is the product obtained by reacting about 23 moles of ethylene oxide with 1 mole of lauryl alcohol. Another example is "SURFYNOL® 465" which is a product obtained by reacting about 10 moles of ethylene oxide with 1 mole of tetramethyidecynediol. "SURFYNOL® 485" is the product obtained by reacting 30 moles of ethylene oxide with tetramethyldecynediol. "PLURONIC® L 35" is a product obtained by reacting 22 moles of ethylene oxide with polypropylene glycol obtained by the condensation of 16 moles of propylene oxide. SURFONIC® N-150 is an ethoxylated alkylphenol.

Alkoxylated amine, long chain fatty amine, long chain fatty acid, alkanol amines, diamines, amides, alkanol amides and polyglycol type surfactants known in the art are also useful. One type of amine surfactant found particularly useful is the group obtained by the addition of a mixture of propylene oxide and ethylene oxide to diamines. More specifically, compounds formed by the addition of propylene oxide to ethylene diamine followed by the addition of ethylene oxide are useful and are available commercially from BASF under the general trade designation TETRONIC®.

Carbowax-type surfactants which are polyethylene glycols having different molecular weights also are useful. For example CARBOWAX® 1000 has a molecular weight range of from about 950 to 1050 and contains from 20 to 24 ethoxy units per molecule. CARBOWAX® 4000 has a molecular weight range of from about 3000 to 3700 and contains from 68 to 85 ethoxy units per molecule. Other known nonionic glycol derivatives such as polyalkylene glycol ethers and methoxy polyethylene glycols which are available commercially can be utilized as surfactants in the compositions of the invention.

Ethylene oxide condensation products with fatty acids also are useful nonionic surfactants. Many of these are available commercially such as under the general trade name ETHOFAT® from Armak Chemical Division of Akzona, Inc., Chicago, Ill. Examples include condensates of oleic acid, linoleic acid, etc. Ethylene oxide condensates of fatty acid amides, e.g., oleamide, also are available from Armak.

In some of the solutions, improved results are obtained when polyoxyalkylated glycols, phenols and/or naphthols are included. For example ethylene oxide and propylene oxide condensates with aliphatic alcohols, sorbitan alkyl esters, alkyl, alkoxy and styrenated phenols and naphthols are useful additives. About 6 to about 40 moles of the oxide may be condensed with the above identified compound. Many of these condensates are available commercially under such trade names as TWEEN® from ICI America, TRITON® from Rohm & Haas Co., TERGITOL® from Union Carbide, and IGEPAL® from General Aniline and Film Corp.

The surfactants utilized also may be amphoteric surfactants. The preferred amphoteric surfactants include betaines and sulfobetaines, and sulfated or sulfonated adducts of the condensation products of ethylene oxide and/or propylene oxide with an alkyl amine or diamine.

Typical betaines include lauryldimethylammonium betaine and stearyl dimethylammonium betaine. Sulfated and sulfonated adducts include TRITON® QS-15 (Rohm & Haas Co.), a sulfated adduct of an ethoxylated alkylamine, MIRANOL® HS, a sodium salt of a sulfonated lauric derivative, MIRANOL® OS, a sodium salt of a sulfonated oleic acid, etc. Cationic surfactants also are useful and such surfactants may be selected from the group consisting of higher alkyl amine salts, quaternary ammonium salts, alkyl pyridinium salts and alkyl imidazolium salts.

Cationic surfactants obtained by condensation of various amounts of ethylene oxide or propylene oxide with primary fatty amines are useful and may be represented by the following formula VII:

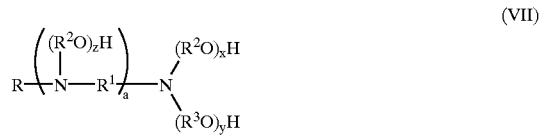

(VII)

wherein R is a fatty acid alkyl group containing from about 8 to about 22 carbon atoms, $R^1$ is an alkylene radical containing up to about 5 carbon atoms, $R^2$ and $R^3$ are each independently an ethylene or propylene group, a is 0 or 1, and x, y and z are each independently integers from 1 to about 30, and the sum of x, y, and z is an integer of from about 2 to about 50.

More particularly, the alkoxylated amines utilized are represented by the formulae VIII and IX:

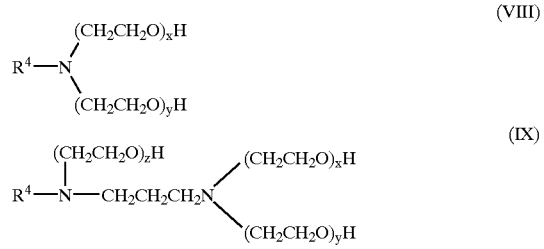

wherein $R^4$ is a fatty acid alkyl group containing from 12 to 18 carbon atoms, and x, y and z are as defined in formula VII.

The above described cationic surfactants are known in the art and are available from a variety of commercial sources. Specific examples of fatty acid amines containing from 8 to 22 carbon atoms include saturated as well as unsaturated aliphatic amines such as octyl amine, decyl amine, lauryl amine, stearyl amine, oleyl amine, myristyl amine, palmityl amine, dodecyl amine, and octadecyl amine.

The alkoxylated amines of the type represented by formula VIII are available from the Armak Chemical Division of Akzona, Inc., Chicago, Ill., under the general trade designation ETHOMEEN®. Specific examples of such products include ETHOMEEN®C/15 which is an ethylene oxide condensate of a coconut fatty amine containing about 5 moles of ethylene oxide; ETHOMEEN®C/20 and C/25 which also are ethylene oxide condensation products from coconut fatty amine containing about 10 and 15 moles of ethylene oxide, respectively; ETHOMEEN® S/15 and S/20 which are ethylene oxide condensation products with stearyl amine containing about 5 and 10 moles of ethylene oxide per mole of amine, respectively; and ETHOMEEN® T/15 and T/25 which are ethylene oxide condensation products of tallow amine containing about 5 and 15 moles of ethylene oxide per mole of amine, respectively. Commercially available examples of the alkoxylated amines of the type represented by formula (IX) include ETHODUOMEEN® T/13 and T/20 which are ethylene oxide condensation products of N-tallow trimethylene diamine containing about 3 and 10 moles of ethylene oxide per mole of diamine respectively. Another type of useful cationic surfactant is represented by the Formula X:

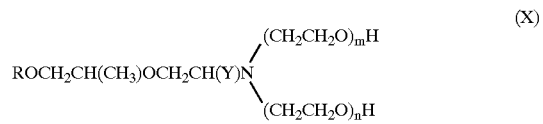

where R is an alkyl group containing from about 8 to about 12 carbon atoms, Y is a methyl or a hydroxyl group, m and n are integers, the sum of which is from about 2 to about 20.

The amine ethoxylate surfactants of the type represented by formula X exhibit the characteristics of both cationic and nonionic surfactants with the nonionic properties increasing at the higher levels of ethoxylation. That is, as the sum of x and y increases, the ethoxylated amine behaves more like a nonionic surfactant.

The cationic surfactant also may be:

(a) a quaternary ammonium salt of the formula XI:

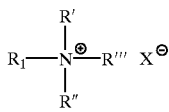

(XI)

wherein X represents a halogen, a hydroxyl group, or the residue of a $C_{1-5}$ alkanesulfonic acid; $R_1$ represents an alkyl group; R' and R" represent a $C_{1-4}$ alkyl group; and R'" represents a $C_{1-10}$ alkyl group or a benzyl group;

(b) pyridinium salts represented by the general formula XII:

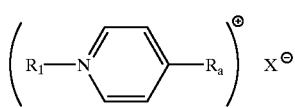

(XIII)

wherein X represents a halogen, a hydroxyl group, or the residue of a $C_{1-5}$ alkanesulfonic acid; $R_1$ represents a $C_{8-20}$ alkyl group; and $R_a$ represents hydrogen or a $C_{1-4}$ alkyl group;

(c) imidazolinium salts represented by the general formula XIII:

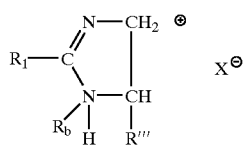

(XIII)

wherein X represents a halogen, a hydroxyl group, or the residue of a $C_{1-10}$ alkanesulfonic acid; $R_1$ represents a $C_{8-20}$ alkyl group; $R_b$ represents a hydroxy-containing $C_{1-5}$ alkyl group; and R'" represents a $C_{1-10}$ alkyl group or a benzyl group; and (d) higher alkyl amine salts represented by the general formula XIV:

$$[R_1-NH_3]^{(+)}CH_3-(CH_2)_n-COO^{(-)} \quad \text{(XIV)}$$

wherein $R_1$ represents a $C_{8-20}$ alkyl group; and n is from 0 to about 4.

Examples of the above described cationic surfactants, in the form of salts, are lauryltrimethylammonium salt, cetyltrimethylammonium salt, stearyltrimethylammonium salt, laurydimethylethylammonium salt, octadecyidimethylethylammonium salt, dimethylbenzyllaurylammonium salt, cetyldimethylbenzylammonium salt, octadecyidimethylbenzylammonium salt, trimethylbenzylammonium salt, triethylbenzylammonium salt, hexadecylpyridinium salt, laurylpyridinium salt, dodecylpicolinium salt, 1-hydroxyethyl-1-benzyl-2-laurylimidazolinium salt, 1-hydroxyethyl-1-benzyl-2-oleylimidazolinium salt, stearylamine acetate, laurylamine acetate, and octadecylamine acetate.

The surfactants also may be anionic surfactants. Examples of useful anionic surfactants include sulfated alkyl alcohols, sulfated lower ethoxylated alkyl alcohols, and their salts such as alkali metal salts. Examples of such surfactants include sodium lauryl sulfate (Duponol C or QC from Du Pont), sodium mixed long chain alcohol sulfates available from Du Pont under the designation Duponol WN, sodium octyl sulfate available from Alcolac, Ltd. under the designation Sipex OLS, Sodium tridecyl ether sulfate (Sipex EST), sodium lauryl ether sulfate (Sipon ES), magnesium lauryl sulfate (Sipon LM), the ammonium salt of lauryl sulfate (Sipon L-22), diethanolamino lauryl sulfate (Sipon LD), sodium dodecylbenzene sulfonate (SIPONATE® DS), etc.

The surfactant(s) may be present in an amount from about 1 g/l to about 100 g/l. In one embodiment, the surfactant is present in an amount from about 2 g/l to about 20 g/l. In one embodiment, the surfactant is present in an amount from about 5 g/l to about 15 g/l. In another embodiment, the surfactant is present in an amount of about 5 g/l. In another embodiment, the surfactant is present in an amount of about 10 g/l. In another embodiment, the surfactant is present in an amount of about 9.9 g/l. In another embodiment, no surfactant is added to the immersion plating composition.

The immersion plating compositions of the present invention also may contain urea or a urea derivative, homolog or analog thereof. Examples of useful urea derivatives are found in U.S. Pat. No. 4,657,632, which is incorporated herein by reference. Specific examples include urea nitrate, urea oxalate, 1-acetylurea, 1-benzylurea, 1-butylurea, 1,1-diethylurea, 1,1-diphenylurea, 1-hydroxyurea, etc. The urea compound may be present in an amount from in the range from about 10 to about 125 g/l.

The immersion plating compositions of the present invention also may contain one or more amidine compounds. Aqueous immersion plating baths including amidines and methods for plating using such baths have been described in U.S. Pat. No. 6,063,172, the disclosure of which is incorporated herein by reference, for its teachings of such immersion plating baths and associated methods. The amidine compounds may be characterized generally by the formula XV:

$$RC(=NH)NH_2 \quad \text{(XV)}$$

and the acid salts thereof, wherein R is hydrogen, a hydroxyl group, an aliphatic, alicyclic, aromatic or heterocyclic group, an amino group, an amidino group, and amidinoaryl group, a carboxyalkyl group, or an —NHR' group wherein R' is an aliphatic, alicyclic, aminoalkyl, amidoalkyl or carboxyalkyl group.

The acid salts include salts such as the formates, acetates, hydrochlorides, carbonates, etc. of such amidines. The aliphatic and alkyl groups contain from one to about 10 or more carbon atoms, whereas the alicyclic and aromatic (or aryl) groups contain from about 6 to about 20 or more carbon atoms, and the heterocyclic groups contain from about 4 to about 20 carbon atoms.

Examples of such amidines are as follows. The list is exemplary only and is not to be considered as a limitation on the above formula.

| | Formula | Name |
|---|---|---|
| R | | |
| Hydrogen | H—C(=NH)NH$_2$ | formamidine |
| Hydroxyl | HO—C(=NH)NH$_2$ | isourea |
| Aliphatic | CH$_3$C(=NH)NH$_2$ | ethanamidine |
| | CH$_3$CH$_2$CH(CH$_2$CH$_3$)—CH$_2$CH$_2$C(=NH)NH$_2$ | 4-ethylhexanamidine |
| Alicyclic | 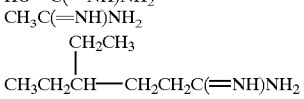 | Cyclohexanecarboxamidine |
| | 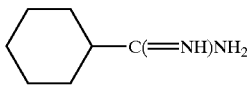 | Pyrrole-2-carboxamidine |
| Heterocyclic | 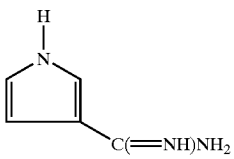 | 2,6-diazanaphthalene-3,7-Dicarboxamide |
| Aromatic | 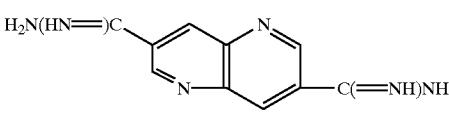 | 2-naphthamidine |
| | 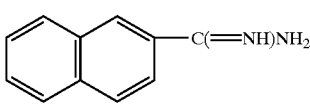 | Benzamidine |
| Amino | H$_2$N—C(=NH)NH$_2$ | guanidine |
| Aminoalkyl | H$_2$NCH$_2$CH$_2$C(=NH)NH$_2$ | 1-aminopropanamidine |
| Amidinoalkyl | H$_2$N(HN=)C(CH$_2$)$_3$C(=NH)NH$_2$ | pentanediamidine |
| Amidino | H$_2$N(HN=)C—C(=NH)NH$_2$ | ethanediamidine |
| Amidinoaryl | H$_2$N(HN=)C—C$_6$H$_4$—C(=NH)NH$_2$ | 1,4-benzenedicarboxamidine |
| Carboxyalkyl | H$_2$N(HN=)C(CH$_2$)$_3$COOH | 4-carbaminidoylbutanoic acid |
| R$^1$ = | | |
| Aliphatic | CH$_3$NH C(=NH)NH$_2$ | methyl guanidine |
| Alicyclic | 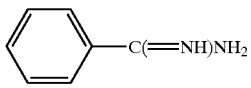 | Cyclohexyl guanidine |
| Amidino | H$_2$N(HN=)C—NH—C(=NH)NH$_2$ | biguanidine |
| Aminoalkyl | H$_2$N(CH$_2$)$_4$NH—C(=NH)NH$_2$ | aminobutylguanidine |
| Carboxylalkyl | H$_2$N(HN=)C—NH—CH$_2$COOH | 3-guanidinoacetic acid |
| | H$_2$N(HN=)C—NH—(CH$_2$)$_2$COOH | 3-guanidinobutanoic acid |
| amidoalkyl | H$_2$N(HN=)C—NH—CH$_2$CH$_2$CONH$_2$ | 3-guanidino propionamide |
| Heterocyclic | 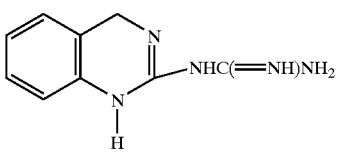 | 2-guanidinobenzimidazole |

The amount of amidine compound included in the immersion plating compositions may vary over a wide range such as from about 1 g/l of the plating bath up to about 100 g/l. In one embodiment, the amount of amidine compound in the immersion plating composition is in the range from about 1 g/l to about 10 g/l. In another embodiment, the amount of amidine compound in the immersion plating composition is in the range from about 5 g/l to about 50 g/l. In one embodiment, the amount of amidine compound in the immersion plating composition is in the range from about 10 g/l to about 25 g/l.

In one embodiment, the immersion plating compositions of this invention are substantially free of thiourea and thiourea derivatives.

The immersion plating compositions of the present invention may be utilized in the plating of the intergranular etched surface of the metal substrate using an immersion, a spray, a flood or a cascade application process. The immersion plating compositions useful in the method of this invention can be prepared by adding the components to water. The components can be added in any order. The compositions may be stirred mechanically or ultrasonically to accelerate the displacement reaction.

The metal substrate, for example copper circuitry, may be contacted with the immersion plating compositions by immersing or dipping the –intergranular etched surface into the immersion plating compositions maintained at a temperature of from about 0° C. to about 70° C. in a continuous process. In one embodiment, the temperature of the composition is in the range of from about 25° C. to about 35° C. In one embodiment, the composition is maintained at a temperature of from about 20° C. to about 50° C. In another embodiment, the temperature of the composition is in the range of from about 35° C. to about 45° C. In another embodiment, the temperature of the composition is in the range of from about 5° C. to about 25° C. In another embodiment, the temperature of the composition is in the range of from about 15° C. to about 35° C.

The plating times may vary in accordance with the desired thickness of the deposited immersion plated metal coating or layer. In one embodiment, the intergranular etched surface is immersed in the immersion plating composition for a period in the range from about 1 second up to 15 minutes. In another embodiment, the intergranular etched surface is immersed in the immersion plating composition for a period in the range from about 1 minute to about 2 minutes. In another embodiment, the intergranular etched surface is maintained in the immersion plating composition for about 1 to about 5 minutes. In another embodiment, the intergranular etched surface may be maintained in the immersion plating composition for about 5 to about 60 minutes. The time may be selected so as to provide the desired metal coating quality and thickness.

The immersion plated metal may be applied in a layer ranging from about 0.01 to about 2 $\mu$m (0.4–80 microinches ($\mu$in); 1 $\mu$in≅0.0254 $\mu$m). In one embodiment, the immersion plated metal thickness ranges from about 0.1 $\mu$m to about 3 $\mu$m. In another embodiment, the immersion plated metal has a thickness in the range from about 0.5 $\mu$m to about 1 $\mu$m. In another embodiment, the immersion plated metal has a thickness in the range from about 1 $\mu$m to about 2 $\mu$m. In another embodiment, the immersion plated metal has a thickness of about 1 $\mu$m. In another embodiment, the immersion plated metal has a thickness in the range from about 0.8 $\mu$m to about 1.5 $\mu$m. In another embodiment, the immersion plated metal has a thickness of about 1.2 $\mu$m.

The various components of the immersion plating compositions useful in the method of the present invention may be present at the concentrations described above. In one embodiment, the immersion plating composition may contain:

about 1 g/l to about 150 g/l of each immersion-platable metal;

about 20 g/l to about 500 g/l of the acid; and about 25 g/l to about 150 g/l of the complexing agent compound.

The composition also may contain:

about 1 g/l to about 100 g/l of a surfactant;

about 1 g/l to about 125 g/l of a urea or amidine compound;

about 5 g/l to about 50 g/l of a chelating agent; and about 5 g/l to about 110 g/l of a secondary reducing agent.

The concentrations may, of course, vary depending on the particular plating application intended.

The methods of the present invention, employing the above-described immersion plating compositions may be utilized in the plating of intergranular etched metal substrates such as copper, copper alloys, and other metals by immersion plating, also referred to as electroless plating or chemical displacement. The application steps may include immersing or dipping the substrate in the plating solution, or may include spraying, flooding or cascading the solution onto the substrate, or may include combinations of these methods. As described above, the immersion plating portion of the inventive process, like the overall process, is preferably operated on a continuous basis, such as in a horizontal, conveyorized apparatus.

The metal layers produced by the methods of the invention are dense and adhere tightly to the underlying intergranular etched metal substrate.

(C) Silane Layer

The metal foils which have been treated as set forth in the foregoing disclosure, i.e., subjected to a process for treating a metal surface to improve adhesion of polymeric materials thereto, comprising the steps of intergranular etching the surface of the metal substrate with an intergranular etching composition, and applying to the intergranular etched surface an immersion plated metal by immersion plating in an immersion plating composition comprising one or more plating metals selected from tin, silver, bismuth, copper, nickel, lead, zinc, indium, palladium, platinum, gold, cadmium, ruthenium, cobalt, gallium and germanium, optionally may be further treated by applying an organosilane layer, to further improve adhesion of the metal surface to a substrate such as a polymeric material for a PCB.

In one embodiment, the organosilane treatment is that disclosed in U.S. Pat. No. 5,073,456, the disclosure of which is hereby incorporated by reference for its teaching of the silane treatment.

An organosilane mixture described in the '456 patent may be applied as a coating either to the intergranular etched, immersion plated metal layer or to the polymeric material. In one embodiment, the polymeric material is a partially cured thermosetting polymer composition, also known in the art as a prepreg or "B" stage resin. In either case, the metal layer and the prepreg are subsequently laminated whereby the silane forms a bond between the metal layer and the prepreg. The same or different materials of construction as the polymeric layer can be employed for the prepreg layer.

It is noted that one side of the intergranular etched, immersion plated metal substrate may be attached to a polymeric material prior to any of the foregoing treatments, although it may be preferred to subject both sides of the metal substrate to the foregoing treatments. Thus the silane may be applied to only one side of the treated metal substrate.

The moisture resistant, adherent, organosilane layers of this embodiment are prepared from a silane bonding mixture which comprises (A) at least one ureido silane having the formula (XVI):

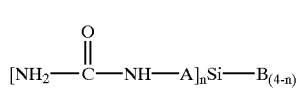

(XVI)

where A is an alkylene having 1 to 8 carbon atoms, B is a hydroxy or an alkoxy having 1 to 8 carbon atoms and n is an integer of 1, 2, or 3 with the proviso that if n is 1 or 2, B need not be identical; and (B) a disilyl crosslinking agent having the formula (XVII):

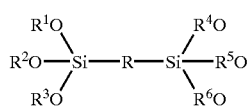
(XVII)

wherein $R^1$, $R^2$, $R^3$, $R^4$, $R^5$ and $R^6$ independently of the other is an alkyl with 1 to 8 carbon atoms and where R denotes an alkylene group having 1 to 8 carbon atoms. In one embodiment, $R^1$, $R^2$, $R^3$, $R^4$, $R^5$ and $R^6$ are identical. In one embodiment, each of $R^1$, $R^2$, $R^3$, $R^4$, $R^5$ and $R^6$ are ethyl.

In one embodiment, in formula (XVI) of the ureido silane each B group is identical if more than one B group is present. In the one embodiment in formula (XVI) of the ureido silane the alkylene group, A, is a divalent ethylene or propylene and the alkoxy group, B, is a methoxy or ethoxy group. In one embodiment, the ureido silane is gamma-ureidopropyltriethoxysilane.

In one embodiment, the disilyl crosslinking agent of formula (XVII), the alkyl groups $R^1$, $R^2$, $R^3$, $R^4$, $R^5$ and $R^6$ are each ethyl and the alkylene group, R, is a divalent ethylene or propylene group. In one embodiment, the disilyl crosslinking agent is hexaethoxydisilylethane.

In one embodiment, the disilyl crosslinking agent of formula XVII may be replaced by or have added thereto an alternate disilyl crosslinking agent in which one or more of the —OR groups has been replaced with a lower alkyl group, particularly a methyl or ethyl group. It has been found that such an alternative silane may retain its water solubility. Thus, for example, if one or two of the —OR groups are replaced by a lower alkyl group, the disilyl crosslinking agent will remain water soluble. Such an embodiment provides a crosslink of comparable strength but of a more organic nature, and may be applied from an aqueous solution.

For example, in a mixture as in the present embodiment of, e.g., gamma-ureidopropyltrimethoxysilane and hexamethoxybissilylethane (formula XVII in which R=ethane and $R^1$–$R^6$=methyl), in an exemplary ratio in the range from 0.5:1 to 4:1, a similar mixture can be prepared in which, e.g., methylpentamethoxybissilylethane is used in place of, or together with, the hexamethoxybissilylethane. The water solubility of the hexamethoxy compound is retained by the methylpentamethoxybissilylethane.

The component concentrations of the silane bonding mixture may vary widely to meet the needs of a particular application. Thus the weight ratio of the ureido silane of formula (XVI) to the disilyl crosslinking agent of formula (XVII) may be between 99:1 and 1:99. In one embodiment, the weight ratio of (XVI):(XVII) is between 90:10 and 10:90. In one embodiment, the weight ratio of (XVI):(XVII) is between 90:10 and 70:30. Typically a single ureido silane is used with a single disilyl crosslinking agent, however, it is possible to use in the silane bonding mixture, two or more ureido silanes as defined and/or two or more disilyl crosslinking agents as defined. The silane bonding mixture, in one embodiment, is DuraBOND® 776PT, which is commercially available from McGean-Rohco, Inc., Cleveland, Ohio. The product DuraBOND® 776PT comprises approximately equimolar amounts of gamma-ureidopropyltriethoxysilane as the ureido silane (XVI), and bis(triethoxysilyl)ethane as the disilyl crosslinking agent (XVII).

In one embodiment, the intergranular etched metal substrate to which an immersion plated metal has been applied may be treated with organosilane compositions which comprise (A) a silane coupling agent; and (B) a tris(silylorgano) amine or alkane characterized by either the formula:

$$[(RO)_3SiR^1]_3N \qquad (XVIII)$$

or the formula:

$$[(RO)_3SiR^1]_3CR^2 \qquad (XIX)$$

wherein each R is independently an alkyl, alkoxyalkyl, aryl, aralkyl or cycloalkyl group of less than 20 carbon atoms; $R^1$ is a divalent hydrocarbon or polyether group of less than 20 carbon atoms; and $R^2$ is a functional group represented by $$C_nH_{2n}X$$

wherein n is from 0 to 20 and X is selected from amino, amido, hydroxy, alkoxy, halo, mercapto, carboxy, acyl, vinyl, allyl, styryl, epoxy, isocyanato, glycidoxy, and acryloxy groups.

The silane compositions of the present embodiment contain at least one silane coupling agent (A). Silane coupling agents such as (A) are well known, and various conventional silane coupling agents can be utilized. In one embodiment, the silane coupling agents (A) are characterized by the formula $$A_{(4-x)}Si(B)_x \qquad (XX)$$

wherein A is a hydrolyzable group, x is 1, 2 or 3, and B is a monovalent organic group. The A groups are groups which hydrolyze in the presence of water and may include acetoxy groups, alkoxy groups containing up to 20 carbon atoms and chloro groups. In one embodiment, x=1 and each A is an RO-group such as represented by the formula $$(RO)_3SiB \qquad (XXa)$$

wherein each R is independently an alkyl, aryl, aralkyl or cycloalkyl group containing less than 20 carbon atoms, more often up to about 5 carbon atoms. The number of hydrolyzable groups A present in the silane coupling agent of Formula (XX) may be 1, 2 or 3 and is preferably 3 (i.e., x=1).

Specific examples of RO groups include methoxy, ethoxy, propoxy, methylmethoxy, ethylmethoxy, phenoxy, etc. Ethoxy is preferred.

The Group B in Formula XX may be an alkyl or aryl group, or a functional group represented by the formula $$-C_nH_{2n}X$$

wherein n is from 0 to 20 and X is selected from amino, amido, hydroxy, alkoxy, halo, mercapto, carboxy, acyl, vinyl, allyl, styryl, epoxy, isocyanato, glycidoxy and acryloxy groups. The alkyl and aryl groups may contain up to about 10 carbon atoms. Alkyl groups containing from 1 to about 5 carbon atoms are particularly useful. In one embodiment, n is an integer from 0 to 10. In one embodiment, n is an integer from 1 to about 5.

When the group B is an amino group, the amino groups may contain one or more nitrogen atoms and, thus, may be monoamino groups, diamino groups, triamino groups, etc. General examples of diamino silane coupling agents can be represented by the formula $$A_3SiR^4N(R^5)R^4N(R^5)_2 \qquad (XXb)$$

wherein A is as defined in Formula XX, each $R^4$ is independently a divalent hydrocarbyl group containing from 1 to about 5 carbon atoms, and each $R^5$ is independently hydrogen or an alkyl or an aryl group containing up to about 10 carbon atoms. The divalent hydrocarbyl groups $R^4$ include methylene, ethylene, propylene, etc. In one embodiment, $R^4$ is ethylene. In one embodiment, $R^5$ is hydrogen or a methyl or ethyl group. In one embodiment, $R^5$ is ethyl.

When the group B is an amido group, the amido groups may be represented by one of the formulae

—$R^4C(O)N(R^5)_2$ or

—$R^4$—$N(R^5)C(O)N(R^5)_2$ wherein each $R^4$ is independently a divalent hydrocarbyl group containing from 1 to 20 carbon atoms, more often from 1 to about 5 carbon atoms, and each $R^5$ is independently hydrogen or an alkyl or aryl group containing up to about 10 carbon atoms. Thus, the amido group may be an amide group or an ureido group. In one embodiment, each $R^5$ in the formulae for the amido groups is hydrogen or an alkyl group containing from 1 to about 5 carbon atoms.

In one embodiment, the silane coupling agent is a ureido silane represented by the formula $$(RO)_3SiR^4N(H)C(O)NH_2 \qquad (XXc)$$

wherein each R is an alkyl group containing 1 to about 5 carbon atoms, particularly methyl or ethyl groups, and $R^4$ is a divalent hydrocarbyl group containing from 1 to about 5 carbon atoms. Examples of such divalent hydrocarbyl groups include methylene, ethylene, propylene, butylene, etc. Specific examples of ureido silanes include β-ureidoethyltrimethoxy silane; β-ureidoethyl-triethoxy silane; γ-ureidoethyltrimethoxy silane; γ-ureidopropyltriethoxy silane, γ-glycidoxypropyltrimethoxy silane, β-(3,4-epoxycyclohexyl)ethyltrimethoxysilane, γ-aminopropyltrimethoxys silane, γ-chloropropyltrimethoxy silane, vinyltriethoxy silane, tris-trimethoxysilylpropylamine.

Other examples of silane coupling agents useful in the present invention include N-(2-aminoethyl)-3-aminopropyltriethoxysilane, 3-methacryloxypropyltriethoxysilane, methacryloxypropenyltrimethoxysilane, 3-methacryloxypropyltris(methoxyethoxy)silane, 3-(N-styrylmethyl-2-aminoethylamino)propyltrimethoxysilane, 3[2-(vinylbenzylamino)ethylamino]-propyltriethoxysilane, 3-glycidoxypropyltriethoxysilane, triacetoxyvinylsilane, tris-(2-methoxyethoxy) vinylsilane, 1-triethoxysilyl-2-(p,m-chloromethyl)-phenylethane, 3-chloropropyltriethoxysilane N-(aminoethylaminomethyl)-phenyltriethoxysilane, N-(2-aminoethyl)-3-aminopropyl tris(2-ethylhexoxy)silane, 3-aminopropyltriethoxysilane, triethoxysilylpropylenetriamine, β-(3,4-epoxycyclohexyl)-ethyltriethoxysilane, 3-mercaptopropyltriethoxysilane, 3-mercaptopropylmethyldiethoxysilane, bis(2-hydroxyethyl)-3-aminopropyltriethoxysilane, 1,3-divinyltetramethyldisilazane, vinyltriethoxysilane, 2-(diphenylphosphino)-ethyltriethoxysilane, 2-methacryloxyethyldimethyl-[3-triethoxysilylpropyl] ammonium chloride, 3-isocyanatopropyldimethylethoxysilane, N-(3-acryloxy-2-hydroxypropyl)-3-aminopropyltriethoxysilane, vinyl tris(t-butylperoxy)silane, methyltriethoxysilane, ethyltriethoxysilane, phenyltriethoxysilane, phenyltriacetoxysilane, methyltriethoxysilane, phenyltriethoxysilane, N-(3-trimethoxysilylpropyl) pyrrole, N-[3-(triethoxysilyl)propyl]-4,5-dihydroimidazole, β-trimethoxysilylethyl-2-pyridine, N-phenylaminopropyltrimethoxysilane, 3-cyclopentadienylpropyltriethoxysilane, 7-oct-1-enyltrimethoxysilane.

The preferred silane coupling agents are those which are commercially available and which are recognized by those skilled in the art as being effective coupling agents. A number of organofunctional silanes are available, for example, from Union Carbide, Specialty Chemicals Division, Danbury, Conn. Some examples are shown in Table I.

TABLE I

Silane Coupling Agents

| Type | Trade Designation | Formula |
|---|---|---|
| Esters | A-137 | $(EtO)_3SiC_8H_{17}$ |
|  | A-162 | $(EtO)_3SiCH_3$ |
| Amino | A-1100 | $(EtO)_3Si(CH_2)_3NH_2$ |
|  | A-1110 | $(MeO)_3Si(CH_2)_3NH_2$ |
|  | A-1120 | $(MeO)_3Si(CH_2)_3NH(CH_2)_2NH_2$ |
|  | A-1130 | $(MeO)_3Si(CH_2)_3NH(CH_2)_2NH(CH_2)_2NH_2$ |
| Ureido | A-1160* | $(EtO)_3Si(CH_2)_3NHC(O)NH_2$ |
| Isocyanato | A-1310 | $(EtO)_3Si(CH_2)_3N=C=O$ |
| Vinyl | A-151 | $(EtO)_3SiCH=CH_2$ |
|  | A-171 | $(MeO)_3SiCH=CH_2$ |
|  | A-172 | $(CH_3OC_2H_4O)_3SiCH=CH_2$ |
| Methacryloxy | A-174 | $(MeO)_3Si(CH_2)_3OC(O)C(CH_3)=CH_2$ |
| Epoxy | A-187 |  |
| Mercapto | A-189 | $(MeO)_3Si(CH_2)_3SH$ |

*50% w/w in methanol

Additional silanes which may be used include tetramethoxysilane, tetraethoxysilane and 3-glycidoxypropyltrimethoxysilane. Other examples include tetrapropoxysilane, tetra-n-butoxysilane, γ-glycidoxypropylmethyldimethoxysilane, γ-glycidoxypropylpylpentamethyldisiloxane, γ-glycidoxypropylmethyldiethoxysilane, γ-glycidoxypropyldimethylethoxysilane, (γ-glycidoxypropyl)-bis(trimethylsiloxy)methylsilane, and the like. The foregoing and following silanes may be used in combinations of two or more.

The second component in the silane compositions of the present embodiment is (B) a tris(silylorgano)amine characterized by the formula $$[(RO)_3SiR^1]_3N \qquad (XXI)$$

or a tris(silylorgano)alkane characterized by the formula $$[(RO)_3SiR^1]_3CR^2 \qquad (XXII)$$

wherein in formulae XXI and XXII, each R is independently an alkyl, alkoxyalkyl, aryl, aralkyl or cycloalkyl group of less than 20 carbon atoms; $R^1$ is a divalent hydrocarbon or polyether group of less than 20 carbon atoms; and $R^2$ is a functional group represented by —$C_nH_{2n}X$ wherein n is from 0 to 20 and X is selected from amino, amido, hydroxy, alkoxy, halo, mercapto, carboxy, acyl, vinyl, allyl, styryl, epoxy, isocyanato, glycidoxy, and acryloxy groups.

Preferred examples of R groups include methyl, ethyl, propyl, methoxymethyl, etc. The divalent hydrocarbon or divalent polyether group ($R^1$) may be any of the divalent hydrocarbon or polyether groups described above with respect to $R^1$ in formula XXI. Preferred examples include methylene, ethylene, propylene, butylene, etc. Functional groups represented by $R_2$ may be any of the functional groups described above with respect to (B) in formula (XX).

In one embodiment, each R group in formulae XXI and XXII is independently an alkyl, alkoxy alkyl, aryl, aralkyl or cycloalkyl group of less than 10 carbon atoms and is more often an alkyl group containing from 1 to 5 carbon atoms or an alkoxy alkyl group containing from 2 to 10 carbon atoms.

$R^1$ in formulae XXI and XXII is a divalent hydrocarbon or divalent polyether group containing less than 20 carbon atoms. $R^1$ can be, for example, alkylene groups such as methylene, ethylene, propylene, ethylidene and isopropylidene; cycloalkylenes such as cycloheptylene and cyclohexylene; divalent aromatic groups such as phenylene, tolylene, xylylene, and naphthalene; and divalent groups of aralkanes of the formula

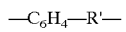
$-C_6H_4-R'-$ wherein R' is an alkylene group such as methylene, ethylene or propylene. $R^1$ also can be, for example, a divalent polyether of the formula

$-R^6(OR^6)_z-$ wherein $R^6$ is an alkylene group and Z is an integer of from 1 to about 5. The divalent polyether group can be, for example, diethylene ether.

$R^2$ in formula XXI is a functional group which may be represented by

$-C_nH_{2n}X$ wherein n is from 0 to 20 and X is selected from amino, amido, hydroxy, alkoxy, halo, mercapto, carboxy, acyl, vinyl, allyl, styryl, epoxy, isocyanato, glycidoxy and acryloxy groups. The functional group $R^2$ in formula XXII may be the same as the functional group (B) in formula XXII described above. Accordingly, the discussion and examples of the functional group (B) in formula XXII is applicable to the functional group $R^2$ in formula XXI and such discussion and examples are hereby incorporated by reference.

The tris(silylorgano)amines represented by formula XVIII which are useful in the silane compositions of the present invention are known compounds, and procedures for preparing such tris(silylorgano)amines have been described in, for example, U.S. Pat. No. 5,101,055; U.S. Pat. No. 2,920,095; and U.S. Pat. No. 2,832,754; and the disclosures of these patents with regard to the tris(silylorgano)amines and methods for preparing such amines are hereby incorporated by reference.

Specific examples of tris(silylorgano)amines of formula XVIII which are useful in the silane compositions of the present invention include tris(trimethoxysilylmethyl)amine; tris(triethoxysilylmethyl)amine; tris(trimethoxysilylethyl) amine; tris(trimethoxysilylethyl)amine; tris (trimethoxysilylethyl)amine; tris(triethoxysilylpropyl) amine; tris(dimethoxyethoxysilylpropyl)amine; tris (tripropoxysilylpropyl)amine; etc.

The silane bonding mixtures may be applied as a liquid solution to the intergranular etched, immersion plated metal surface or insulating layer surface. In general, the silane bonding mixture contains a mutual solvent for the ureido silane and the disilyl crosslinking agent. The solution is applied by any conventional means, e.g., by dipping, spraying, brushing, immersion, etc.

The silane bonding mixtures may comprise other materials such as solvents, fillers, etc. Solvents should be capable of solubilizing the silanes. Typically, such solvents include lower alcohols such as methanol, ethanol, propanol, isopropanol, or one of the butanols. Water, or mixtures of water and alcohols can also be used as a solvent, but the stability of some silanes in such solutions may be more limited than with solutions made with alcohols. Small portions of water may be added to the silane compositions, if needed, in order to hydrolyze the silanes. Alternatively, dispersions or emulsions of the silane compositions can be prepared in suitable organic solvent or mixtures of water and organic solvent. Typical solvents include, in addition to the alcohols described above, ethers, ketones, aliphatic and aromatic hydrocarbons, amides such as N,N-dimethylformamide, etc. Aqueous emulsions of the silane-coupling agents can be prepared in the conventional manner using conventional dispersants and surfactants, including nonionic surfactants. In one embodiment, when the silanes include ethoxy substituents, the solvent contains ethanol.

The solids content of the silane compositions may vary from 100% by weight in pure mixtures to as little as 0.1% by weight or less in very dilute solutions or emulsions. More often, the solids content of solutions will be between 0.5 and 5% by weight.

A wide range of fillers can be included in the silane bonding mixtures. The fillers may be particulate or fibrous fillers, and these include siliceous materials such as glass, quartz, ceramic, asbestos, silicone resin, glass fibers, metals such as aluminum, steel, copper, nickel, magnesium and titanium, metal oxides such as magnesium oxide, iron oxide, and aluminum oxide, and metal fibers and metal-coated glass fibers. The amount of the filler included in the silane compositions may range from 0 to about 10% by weight. When the filler is present, it is more often present in amounts of from about 0.1 to about 3% or 4% by weight.

Multilayer Laminates

In one embodiment, the intergranular etched, immersion plated metals, with or without the silane bonding mixtures, are useful in preparing multi-layer laminates including printed circuit boards (PCBs). Typical multi-layer laminates will comprise (A) at least one non-conductive polymeric material layer, (B) at least one conductive metal substrate or foil which has been subjected to intergranular etching, and (C) an immersion plated metal layer, which has been applied to the surface of the metal substrate or foil, in between the intergranular etched surface and a surface of the polymeric material. Other multilayer laminates may comprise (A) at least one non-conductive polymeric material layer, (B) at least one conductive metal substrate or foil which has been subjected to intergranular etching, (C) an immersion plated metal layer, which has been applied to the intergranular etched metal substrate or foil, and (D) a silane layer, which has been applied to the immersion metal plated layer in between the insulating layer and the conductive immersion plated metal layer.

The immersion plated metal layer applied to the intergranular etched metal substrate, in accordance with this invention, enhances the bond or peel strength between the metal substrate layer of conductive material (e.g., copper) and the layer of polymeric material.

Useful nonconductive polymeric materials include dielectric substrates or layers which may be prepared by impregnating woven glass reinforcement materials with partially cured resins, usually epoxy resins (e.g., difunctional, tetrafunctional and other multifunctional epoxies). Examples of useful resins include amino-type resins produced from the reaction of formaldehyde and urea, or formaldehyde and melamine, polyesters, phenolics, silicones, polyamides, polyimides, diallyl phthalates, phenyl silanes, polybenzimidazoles, diphenyloxides, polytetrafluoroethylenes, cyanate esters, etc. These dielectric substrates often are referred to as prepregs.

An insulating layer and the dielectric layer can be combined and may be prepared by impregnating woven glass reinforcement materials with partially cured resins as described above. Thus, the insulating layer or layers also may be prepregs.

The metal circuitry on the dielectric layer may be prepared from a metal foil layer by conventional techniques such as by a photoimage technique of a photosensitive resist film followed by etching of the unprotected areas of metal on the dielectric layer to form electrically conductive paths or electrically conductive patterns. Circuit-forming etching processes are well known, and examples are described in, for example, U.S. Pat. No. 3,469,982 and U.S. Pat. No. 5,017,271 which are hereby incorporated by reference for their teaching of circuit-forming etching processes.

The metal layer or metal circuitry on the dielectric layer may be intergranular etched by any of the methods described herein. As described above, the intergranular etching process should have removed at least about 40 microinches of metal, on average, from the surface of the metal substrate, and have produced the highly irregular, deeply etched surface characteristic of the intergranular etching steps of the present invention.

The intergranular etched surface of the metal substrate is subjected to a step of applying an immersion plated metal by immersion plating in a composition comprising one or more plating metals selected from tin, silver, bismuth, copper, nickel, lead, zinc, indium, palladium, platinum, gold, cadmium, ruthenium, cobalt, gallium and germanium.

A silane adhesive-promoting layer can then be applied over the thus-treated intergranular etched pattern using the techniques described above, and a second prepreg can be adhered to the intergranular etched pattern.

If the sample is to be treated with an organosilane prior to lamination, an intergranular etched metal substrate which has been coated with an immersion plated metal solution is treated with the solution containing the silane coupling agents and cross-linking agents by dipping the foil into the solutions. The foil is then air dried and baked for one hour at 100° C. As an alternative, a spray application may be used, in which the solutions containing the silane coupling agents and cross-linking agents are spray applied, wiped by rollers and then air-dried. The techniques for laminating multilayer circuit boards are well known in the art.

The multi-layer laminates prepared as described above may be subjected to conventional laminating temperatures and pressures between plates of laminating presses. In this manner, the laminating operation generally will involve pressures in the range of from about 17.6 to about 52.8 bar, temperatures in the range of from about 175° C. to about 350° C. and laminating cycles of from about 30 minutes to about 2 hours. The finished laminates can then be utilized in a variety of applications including printed circuit boards.

For those skilled in the art of multilayer bonding for, e.g., PCBs, the fact that this process works well with epoxy, polyimide and GeTek indicates it would also work well in multilayer bonding processes which employ prepregs made of materials such as cyanate ester (CAS RN 25722-6-1), a polymer formed from bisphenol A cyanate (BT resin CAS RN 68508-55-4), a copolymer of bismaleimide and triazine (bisphenol A cyanate), other epoxy materials such as FR-4 (CAS RN 33294-14-3) and G-10 (CAS RN 1675-54-3), polymers which use polytetrafluoroethylene (PTFE, Teflon®) (CAS RN 9002-84-0), polychlorotrifluroethylene, or other thermoplastics including nylon. That is, any prepreg, thermoset, or thermoplastic useful for creating dielectric insulation between circuitry layers in a multilayer PCB may be used as the laminating material in the present invention.

The advantages of the process of the present invention include enhanced adhesion, enhanced oxidation resistance and enhanced moisture resistance. The improved adhesion obtained with the use of the process of the present invention is demonstrated in part by the following tests and examples. The following provides exemplary solutions which demonstrate the method of the present invention and provide comparisons with the prior art processes. Unless otherwise indicated in the following examples and elsewhere in the specification and claims, all parts and percentages are by weight, temperatures are in degrees centigrade, pressure is at or near atmospheric pressure, and all ranges and ratio limits may be combined.

All treatment temperatures are ~100–120° F. (37–49° C.), unless otherwise specified.

The following materials are used in the examples described below:

Cleaner: 2–3% v/v Besbon 99-L: Besbon 99-L is an alkaline cleaner available from McGean-Rohco, Cleveland, Ohio.

Microetch 1: 5–10% v/v $H_2SO_4$ and 3–5% v/v $H_2O_2$

Microetch 2: ~5% $H_2SO_4$ and 0.5–2 lb/gallon of a mixture of peroxymonosulfuric acid, monopotassium salt, dipotassium sulfate and potassium hydrogen sulfate.

Microetch 3: ~5% $H_2SO_4$ and 0.5–2 lb/gallon potassium persulfate followed by a rinse with 5% $H_2SO_4$ Intergranular etch 1:
(a) The foil is pretreated by conditioning in 2–5% v/v 2-aminoethanol;
(b) the foil is then treated with the following intergranular etch composition:

| | |
|---|---|
| Hydrogen peroxide | 1.8% w/v |
| Concentrated sulfuric acid | 17.5% w/v |
| Benzotriazole | 0.3% w/v |
| Sodium m-nitrobenzene sulfonate | 0.6% w/v |
| water | balance |

Intergranular etch 2:
(a) The foil is treated with the following intergranular etch compsition:

| | |
|---|---|
| Cupric formate | 5% w/v |
| Formic acid (pKa = 3.55) | 2% w/v |
| Ammonium chloride | 8% w/v |
| water | balance |

(b) then the foil is desmutted with a solution of 5–10% HCl

Immersion tin 1: 50% DuraBOND 750As and 50% DuraBOND 750B (McGean-Rohco: Thickness obtained is less than 8 microinches.

Immersion tin 2: 100% Roplate ET-50 (McGean-Rohco), used at ~140° F. (49° C.). Thickness varies based upon immersion time; 20 min. yields approximately 50 microinches.

Silane 1: 1.5–3% v/v DuraBOND 776 PT. Concentrate: 600–2000 mg/l Si (optimum is 1100). A 1:1 molar mixture of γ-ureidopropyltrialkoxysilane and bis(triethoxysilyl)ethane with the pH adjusted to 3.5–4.0 with acetic acid.

Silane 2: 5–10% v/v of an isopropyl alcohol solution containing 50% trimethoxysilylpropyl modified polyethyleneimine.

Epoxy prepreg: Tetrafunctional 1080 scale flow (PolyClad; a polymer of oxirane 2, 2',2",2'''-[1,2-ethanediylidenetetrakis(4,1-phenyleneoxymethylene)]; CAS RN 7328-97-4)

Polyimide prepreg: Ciba 701 polyimide resin based VO 1080 scale flow (Arlon 33-N) a polymer of 4,4' bismaleimide o-phenylmethane and diallyl bisphenol A; CAS RN 6238-33-8

PPO epoxy: GeTek 1080 scale flow (General Electric Plastics) a copolymer of polyphenylene oxide and epoxy.

Polyimide core:

Copper foil: Gould 1 oz. copper foil; FLCS. One side is shiny or drum side, other side is 'treated'.

C-stage: 0.059 inch thick cured prepreg which is prepared by stripping copper clad material.

Sample Preparation for Peel Tests:

Three 4.5 inch square pieces of 1080 prepreg or one piece of 1080 prepreg and two pieces of 7628 prepreg are stacked on C-stage material compatible with the curing temperatures used for curing the prepreg. Then, copper foil which has been prepared by one of the various processes described above is placed adjacent to the top-most piece of prepreg which is always 1080. The stack is then placed between several sheets of paper, this stack is placed between two aluminum 'caul plates' then cured by being heated under pressure. The heating rate is ~10° F./minute (~5° C./min).

For epoxy, the curing pressure is 250 psi, the cure time is 60 minutes and the curing temperature is 350° F. (177° C.). After curing the press is air cooled then pressure released.

For PPO modified epoxy, the curing pressure is 250 psi, the cure time is 120 minutes, and the curing temperature is 380° F. (193° C.). After curing the press is air cooled then pressure released.

For polyimide, the initial curing pressure is 100 psi, the temperature is increased at a constant rate to 250° F. (121° C.). and then is held for about 10 minutes. Then the pressure is increased to 250 psi and the temperature increased to 425° F. (218° C.) and held for 150 minutes. After curing the press is water cooled, briefly air cooled, then pressure released.

Peel Tests:

Peel strength tests gave the results shown in the following tables.

TABLE 1

Peel strengths obtained using epoxy prepreg.

| Treatment | Peel Strength lb/in |
|---|---|
| PRIOR ART: | |
| Cleaner, Microetch 1 | <0.4 |
| Cleaner, Microetch 1, Immersion tin 1, Silane 1 | 4.2–6.0 |
| Cleaner, Conditioner, Intergranular etch 1 | 1.9–3.5 |

TABLE 1-continued

Peel strengths obtained using epoxy prepreg.

| Treatment | Peel Strength lb/in |
|---|---|
| PRESENT INVENTION: | |
| Cleaner, Conditioner, Intergranular etch 1, Immersion Tin 1, | 4.2–5.0 |
| Cleaner, Conditioner, Intergranular etch 1, Immersion Tin 1, Silane 1 | 7.2–8.0 |
| Cleaner, Conditioner, Intergranular etch 1, Immersion Tin 1, Silane 2 | 8.0–10.0 |

TABLE 2

Peel strengths obtained with polyimide prepreg.

| Treatment | Peel Strength lb/in |
|---|---|
| PRIOR ART: | |
| Cleaner, Microetch 2 | <0.4 |
| Cleaner, intergranular etch 1 | 0.3–0.9 |
| PRESENT INVENTION: | |
| Cleaner, intergranular etch 1, Immersion tin 1 | 1.7 |
| Cleaner, Intergranular etch 1, Immersion tin 1, Silane 1 | 1.4–2.0 |
| Cleaner, Intergranular etch 1, Immersion tin 1, Silane 2 | 3.5–4.0 |

TABLE 3

Peel strengths obtained with PPO modified epoxy prepreg.

| Treatment | Peel Strength lb/in |
|---|---|
| PRIOR ART: | |
| Microetch 2, Immersion Tin 1 | 4.9 |
| Microetch 2, Immersion Tin 1, Silane 1 | 2.6 |
| Microetch 2, Immersion Tin 1, Silane 2 | 0.6 |
| Intergranular etch 1 | 4–5 |
| Intergranular etch 2 | 6–8 |
| PRESENT INVENTION: | |
| Intergranular etch 1, Immersion Tin 1 | 5.8–6.7 |
| Intergranular etch 1, Immersion Tin 1, Silane 1 | 6.5 |
| Intergranular etch 1, Immersion Tin 1, Silane 2 | 7.3 |
| Intergranular etch 2, Immersion Tin 1 | 10.6 |
| Intergranular etch 2, Immersion Tin 1, Silane 1 | 8.4 |
| Intergranular etch 2, Immersion Tin 1, Silane 2 | 6.2 |

The preceding peel strength test results demonstrate that application of immersion tin to an intergranular etched copper surface improves peel strength compared to prior art processes in which the surface of the substrate is microetched, with or without subsequent application of an immersion metal, or in which the surface is intergranular etched only. Furthermore, application of silane to an immersion metal plated surface applied over an intergranular etched, immersion metal plated surface often improves peel strength compared to surfaces not treated with a silane.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A process for treating a metal substrate to improve adhesion of polymeric materials thereto, comprising the steps of
intergranular etching a surface of the metal substrate; and
applying an immersion plated metal to the intergranular etched surface by immersing the surface in an immersion plating composition comprising one or more plating metals selected from tin, silver, bismuth, copper, nickel, lead, zinc indium, palladium, platinum, gold, cadmium, ruthenium, cobalt, gallium and germanium,
wherein the step of intergranular etching is carried out with an intergranular etching composition comprising
(a) hydrogen peroxide;
(b) at least one acid, wherein the at least one acid comprises sulfuric acid or a sulfonic acid;
(c) at least one nitrogen-containing, five-membered heterocyclic compound which does not contain any sulphur, selenium or tellurium atom in the heterocycle; and
(d) at least one adhesive compound selected from sulfinic acids, seleninic acids, tellurinic acids, heterocyclic compounds containing at least one sulfur, selenium and/or tellurium atom in the heterocycle, and sulfonium, selenonium and telluronium salts having the general formula (A),

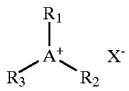

in which
A stands for S, Se or Te;
$R_1$, $R_2$ and $R_3$ stand for alkyl, substituted alkyl, alkenyl, phenyl, substituted phenyl, benzyl, cycloalkyl, substituted cycloalkyl, $R_1$, $R_2$ and $R_3$ being the same or different; and
$X^-$ stands for an anion of an inorganic or organic acid or hydroxide, provided that the acid selected to constitute component (b) is not identical to the sulfinic, seleninic or tellurinic acids selected as component (d).

2. The process of claim 1, wherein the intergranular etched surface comprises intergranular crevices having an aspect ratio of about 1 or greater.

3. The process of claim 1, wherein the intergranular etched surface comprises intergranular crevices having an aspect ratio of about 2 or greater.

4. The process of claim 1, wherein the intergranular etched surface comprises intergranular crevices having a depth of about 1 micron or greater.

5. The process of claim 1, wherein, when the intergranular etched surface is divided into a grid of squares 10 microns on each side, at least 50% of the squares include at least one intergranular crevice having an aspect ratio of at least 1.

6. The process of claim 5, wherein at least 75% of the squares include at least one intergranular crevice having an aspect ratio of at least 1.

7. The process of claim 5, wherein at least 90% of the squares include at least one intergranular crevice having an aspect ratio of at least 1.

8. The process of claim 5, wherein said at least one intergranular crevice has an aspect ratio of at least 2.

9. The process of claim 1, further comprising a step of adhering the immersion metal plated surface to a surface of a polymeric non-conductive material.

10. The process of claim 1, wherein the steps of intergranular etching and applying the immersion plated metal are carried out in a continuous process.

11. The process of claim 1, wherein the immersion plated metal is tin.

12. The process of claim 1, further comprising a step of applying a silane over the immersion plated metal from an aqueous solution of a silane.

13. The process of claim 12, wherein the aqueous solution of a silane comprises about 0.5 wt % to about 3 wt % of one or more of diethoxymethylsilylpropyltriethoxysilane, tris(triethoxysilylpropyl) amine, a trimethoxy silyl propyl modified polyethyleneimine, and a mixture of γ-ureidopropyltriethoxysilane and bis(triethoxysilyl) ethane.

14. The process of claim 12, wherein the aqueous solution of a silane has a pH in the range from about 2 to about 8.

15. The process of claim 1, wherein the immersion plating composition further comprises a thiourea compound.

16. The process of claim 15, wherein the immersion plating composition further comprises a urea compound.

17. The process of claim 1, wherein the immersion plating composition comprises the at least one plating metal in the form of a salt of the metal.

18. The process of claim 1, wherein the step of applying an immersion plated metal is carried out on a continuous basis.

19. The process of claim 18, wherein the metal substrate is in contact with the immersion plating composition for a time from about 1 second to about 900 seconds.

20. The process of claim 1, wherein the immersion plated metal has a thickness in the range from about 4 microinches to about 300 microinches.

21. The process of claim 1, wherein the immersion plating composition comprises (a) a salt of the plating metal, (b) an acid selected from mineral acids, carboxylic acids and hydrocarbyl-substituted sulfonic acids, (c) a complexing agent and (d) water.

22. The process of claim 21, wherein (a) is a stannous salt.

23. The process of claim 21, wherein (a) is a stannous salt of a hydrocarbyl-substituted sulfonic acid, and (b) is the hydrocarbyl-substituted sulfonic acid.

24. The process of claim 9 wherein the polymeric non-conductive material is one or more of PTFE, an epoxy resin, a polyimide, a polycyanate ester, a butadiene terephthalate resin.

25. The process of claim 12 wherein the silane comprises:
(i) a ureido silane having the structure

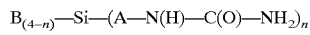

wherein (A) is an alkylene group containing from 1 to about 8 carbon atoms, (B) is a hydroxy or alkoxy group containing from 1 to 8 carbon atoms, and n is an integer from 1 to 3 provided that if n is 1 or 2, each (B) may be the same or different; and (ii) a disylyl crosslinking agent having the structure

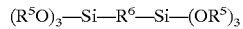

wherein each $R^5$ is independently an alkyl group containing from 1 to about 8 carbon atoms, and $R^6$ is an alkylene group containing 1 to about 8 carbon atoms.

26. The process of claim 12 wherein the silane comprises a trimethoxysilylpropyl modified polyethyleneimine.

27. The process of claim 1, wherein component (c) comprises one or more triazoles, tetrazoles, imidazoles, pyrazoles and purines.

28. The process of claim 1, wherein component (d) is a sulfinic acid selected from aromatic sulfinic acids and compounds having the formula:

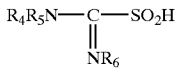

wherein $R_4$, $R_5$ and $R_6$=H, alkyl, substituted alkyl, phenyl, substituted phenyl, $R_7$—(CO)— with $R_7$=H, alkyl, substituted alkyl, phenyl, substituted phenyl, wherein $R_4$, $R_5$ and $R_6$ may be the same or different.

29. The process of claim 1, wherein component (d) is formamidine sulfinic acid.

30. The process of claim 1, wherein component (d) comprises one or more heterocyclic compounds selected from thiophenes, thiazoles, isothiazoles, thiadiazoles, and thiatriazoles.

31. The process of claim 1, wherein component (d) comprises one or more sulfinic acid compounds selected from benzene sulfinic acid, toluene sulfinic acid, chlorobenzene sulfinic acid, nitrobenzene sulfinic acid and carboxybenzene sulfinic acid.

32. The process of claim 1, wherein component (d) comprises one or more sulfonium salts selected from trimethyl sulfonium salts, triphenyl sulfonium salts, methioninealkyl sulfonium salts, and methionine benzylsulfonium salts.

33. A process for treating a metal substrate to improve adhesion of polymeric materials thereto, comprising the steps of
    intergranular etching a surface of the metal substrate; and
    applying an immersion plated metal to the intergranular etched surface by immersing the surface in an immersion plating composition comprising one or more plating metals selected from tin, silver, bismuth, copper, nickel, lead, zinc, indium, palladium, platinum, gold, cadmium, ruthenium, cobalt, gallium and germanium wherein, when the intergranular etched surface is divided into a grid of squares 10 microns on each side, at least 50% of the squares include at least one intergranular crevice having an aspect ratio of at least 5.

34. The process of claim 33, further comprising a step of adhering the immersion metal plated surface to a surface of a polymeric nonconductive material.

35. The process of claim 34, wherein the polymeric nonconductive material is one or more of PTFE, an epoxy resin, a polyimide, a polycyanate ester, a butadiene terephthalate resin.

36. The process of claim 33, wherein the steps of intergranular etching and applying the immersion plated metal are carried out in a continuous process.

37. The process of claim 36, wherein the metal substrate is in contact with the immersion plating composition for a time from about 1 second to about 900 seconds.

38. The process of claim 33, wherein the immersion plated metal is tin.

39. The process of claim 33, further comprising a step of applying a silane over the immersion plated metal from an aqueous solution of a silane.

40. The process of claim 39 wherein the silane comprises:
    (i) a ureido silane having the structure

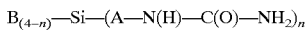

wherein (A) is an alkylene group containing from 1 to about 8 carbon atoms, (B) is a hydroxy or alkoxy group containing from 1 to 8 carbon atoms, and n is an integer from 1 to 3 provided that if n is 1 or 2, each (B) may be the same or different; and
    (ii) a disylyl crosslinking agent having the structure

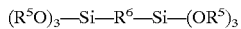

wherein each $R^5$ is independently an alkyl group containing from 1 to about 8 carbon atoms, and $R^6$ is an alkylene group containing 1 to about 8 carbon atoms.

41. The process of claim 39 wherein the silane comprises a trimethoxysilylpropyl modified polyethyleneimine.

42. The process of claim 39, wherein the aqueous solution of a silane comprises about 0.5 wt % to about 3 wt % of one or more of diethoxymethylsilylpropyltriethoxysilane, tris (triethoxysilylpropyl) amine, a trimethoxy silyl propyl modified polyethyleneimine, and a mixture of γ-ureidopropyltriethoxysilane and bis(triethoxysilyl) ethane.

43. The process of claim 39, wherein the aqueous solution of a silane has a pH in the range from about 2 to about 8.

44. The process of claim 33, wherein the immersion plating composition further comprises a thiourea compound.

45. The process of claim 44, wherein the immersion plating composition further comprises a urea compound.

46. The process of claim 33, wherein the immersion plating composition comprises the at least one plating metal in the form of a salt of the metal.

47. The process of claim 33, wherein the immersion plated metal has a thickness in the range from about 4 microinches to about 300 microinches.

48. The process of claim 33, wherein the immersion plating composition comprises (a) a salt of the plating metal, (b) an acid selected from mineral acids, carboxylic acids and hydrocarbyl-substituted sulfonic acids, (c) a complexing agent and (d) water.

49. The process of claim 48, wherein (a) is a stannous salt.

50. The process of claim 48, wherein (a) is a stannous salt of a hydrocarbyl-substituted sulfonic acid, and (b) is the hydrocarbyl-substituted sulfonic acid.

51. A process for treating a metal substrate to improve adhesion of polymeric materials thereto, comprising the steps of
    intergranular etching a surface of the metal substrate; and
    applying an immersion plated metal to the intergranular etched surface by immersing the surface in an immersion plating composition comprising one or more plating metals selected from tin, silver, bismuth, copper, nickel, lead, zinc, indium, palladium, platinum, gold, cadmium, ruthenium, cobalt, gallium and germanium, wherein the step of intergranular etching is carried out with an intergranular etching composition comprising:
    0.5 to 5% w/v hydrogen peroxide; and
    0.01 to 5% w/v of an aromatic sulfonic acid or a salt thereof.

52. The process of claim 51, wherein the sulfonic acid or salt thereof includes one or more aromatic groups which are carbocyclic rings.

53. The process of claim 51, wherein the composition further comprises 0.1 to 2% w/v of a corrosion inhibitor selected from triazoles, tetrazoles, imidazoles, and mixtures thereof.

54. The process of claim 51, wherein the sulfonic acid or salt thereof is sodium m-nitrobenzene sulfonate.

55. The process of claim 51, wherein the intergranular etched surface comprises intergranular crevices having an aspect ratio of about 1 or greater.

56. The process of claim 51, wherein the intergranular etched surface comprises intergranular crevices having an aspect ratio of about 2 or greater.

57. The process of claim 51, wherein the intergranular etched surface comprises intergranular crevices having a depth of about 1 micron or greater.

58. The process of claim 51, wherein, when the intergranular etched surface is divided into a grid of squares 10 microns on each side, at least 50% of the squares include at least one intergranular crevice having an aspect ratio of at least 1.

59. The process of claim 58, wherein at least 75% of the squares include at least one intergranular crevice having an aspect ratio of at least 1.

60. The process of claim 58, wherein at least 90% of the squares include at least one intergranular crevice having an aspect ratio of at least 1.

61. The process of claim 58, wherein said at least one intergranular crevice has an aspect ratio of at least 2.

62. The process of claim 51, further comprising a step of adhering the immersion metal plated surface to a surface of a polymeric non-conductive material.

63. The process of claim 62, wherein the polymeric nonconductive material is one or more of PTFE, an epoxy resin, a polyimide, a polycyanate ester, a butadiene terephthalate resin.

64. The process of claim 51, wherein the steps of intergranular etching and applying the immersion plated metal are carried out in a continuous process.

65. The process of claim 61, wherein the metal substrate is in contact with the immersion plating composition for a time from about 1 second to about 900 seconds.

66. The process of claim 51, wherein the immersion plated metal is tin.

67. The process of claim 51, further comprising a step of applying a silane over the immersion plated metal from an aqueous solution of a silane.

68. The process of claim 67, wherein the silane comprises:

(i) a ureido silane having the structure

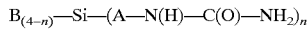

wherein (A) is an alkylene group containing from 1 to about 8 carbon atoms, (B) is a hydroxy or alkoxy group containing from 1 to 8 carbon atoms, and n is an integer from 1 to 3 provided that if n is 1 or 2, each (B) may be the same or different; and (ii) a disylyl crosslinking agent having the structure

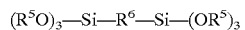

wherein each $R^5$ is independently an alkyl group containing from 1 to about 8 carbon atoms, and $R^6$ is an alkylene group containing 1 to about 8 carbon atoms.

69. The process of claim 67, wherein the silane comprises a trimethoxysilylpropyl modified polyethyleneimine.

70. The process of claim 67, wherein the aqueous solution of a silane comprises about 0.5 wt % to about 3 wt % of one or more of diethoxymethylsilylpropyltriethoxysilane, tris(triethoxysilylpropyl) amine, a trimethoxy silyl propyl modified polyethyleneimine, and a mixture of γ-ureidopropyltriethoxysilane and bis(triethoxysilyl) ethane.

71. The process of claim 67, wherein the aqueous solution of a silane has a pH in the range from about 2 to about 8.

72. The process of claim 51, wherein the immersion plating composition further comprises a thiourea compound.

73. The process of claim 72, wherein the immersion plating composition further comprises a urea compound.

74. The process of claim 51, wherein the immersion plating composition comprises the at least one plating metal in the form of a salt of the metal.

75. The process of claim 51, wherein the immersion plated metal has a thickness in the range from about 4 microinches to about 300 microinches.

76. The process of claim 51 wherein the immersion plating composition comprises (a) a salt of the plating metal, (b) an acid selected from mineral acids, carboxylic acids and hydrocarbyl-substituted sulfonic acids, (c) a complexing agent and (d) water.

77. The process of claim 76, wherein (a) is a stannous salt.

78. The process of claim 76, wherein (a) is a stannous salt of a hydrocarbyl-substituted sulfonic acid, and (b) is the hydrocarbyl-substituted sulfonic acid.

* * * * *

(12) EX PARTE REEXAMINATION CERTIFICATE (6289th)
United States Patent
Whitney, Jr. et al.

(10) Number: US 6,506,314 C1
(45) Certificate Issued: Jul. 8, 2008

(54) ADHESION OF POLYMERIC MATERIALS TO METAL SURFACES

(75) Inventors: Dickson L. Whitney, Jr., Gates Mills, OH (US); George S. Bokisa, North Olmsted, OH (US); Craig V. Bishop, Lakewood, OH (US); Americus C. Vitale, West Chester, PA (US)

(73) Assignee: Atotech Deutschland GmbH, Berlin (DE)

Reexamination Request:
No. 90/007,566, Jun. 3, 2005

Reexamination Certificate for:
Patent No.: 6,506,314
Issued: Jan. 14, 2003
Appl. No.: 09/628,036
Filed: Jul. 27, 2000

(51) Int. Cl.
*H05K 3/38* (2006.01)
*B44C 1/22* (2006.01)

(52) U.S. Cl. .............. 216/100; 216/2; 216/83; 428/174; 428/446; 428/607; 427/97.1; 427/98.8; 427/99.5

(58) Field of Classification Search ............... None
See application file for complete search history.

(56) References Cited

U.S. PATENT DOCUMENTS

| | | |
|---|---|---|
| 4,715,894 A | 12/1987 | Holtzman et al. |
| 4,895,099 A | 1/1990 | D'Amato |
| 5,073,456 A | 12/1991 | Palladino |
| 5,554,211 A | 9/1996 | Center et al. |
| 5,869,130 A | 2/1999 | Ferrier |
| 6,036,758 A | 3/2000 | Fairweather |
| 6,086,779 A * | 7/2000 | Bishop et al. ............. 216/93 |
| 6,242,079 B1 | 6/2001 | Mikado et al. |
| 6,284,309 B1 | 9/2001 | Bishop et al. |
| 6,562,149 B1 * | 5/2003 | Grieser et al. ............ 148/270 |

FOREIGN PATENT DOCUMENTS

| | | |
|---|---|---|
| EP | 0 926 265 A1 | 6/1999 |
| EP | 1 051 888 B1 | 3/2002 |
| WO | WO 99/40764 | 12/1999 |

* cited by examiner

*Primary Examiner*—Jerry D. Johnson

(57) ABSTRACT

The present invention relates to a process for treating a metal substrate to improve adhesion of polymeric materials thereto, comprising the steps of intergranular etching a surface of the metal substrate; and applying an immersion plated metal to the intergranular etched surface by immersing the surface in an immersion plating composition comprising one or more plating metals selected from tin, silver, bismuth, copper, nickel, lead, zinc, indium, palladium, platinum, gold, cadmium, ruthenium, cobalt, gallium and germanium. In one embodiment, the immersion plated metal is tin. In one embodiment, the process further comprises a step of adhering the immersion metal plated surface to a surface of a polymeric non-conductive material. In another embodiment, the polymeric nonconductive material is one or more of PTFE, an epoxy resin, a polyimide, a polycyanate ester, a butadiene terephthalate resin, or mixtures thereof. In one embodiment, the process further comprises a step of applying a silane over the immersion plated metal from an aqueous solution of a silane.

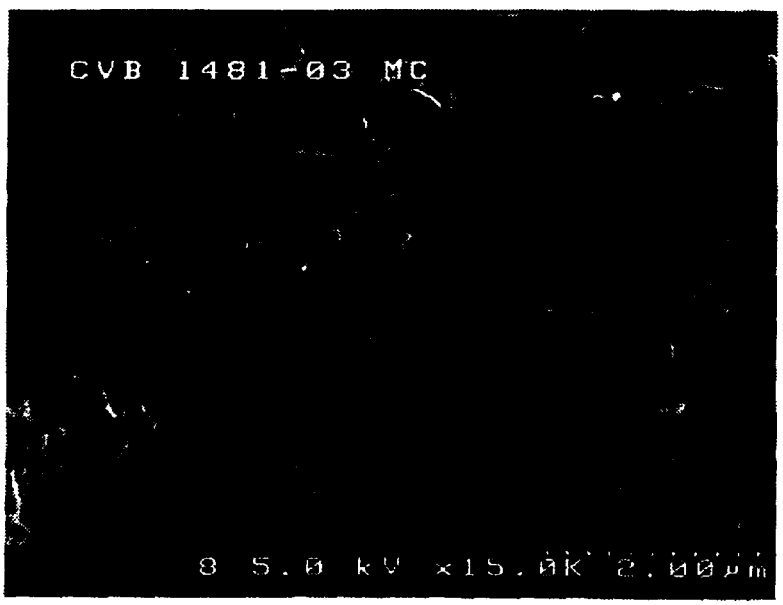

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 33 and 51 are determined to be patentable as amended.

Claims 2–32, 34–50 and 52–78, dependent on an amended claim, are determined to be patentable.

1. A process for treating a metal substrate to improve adhesion of polymeric materials thereto, comprising the steps of
   intergranular etching a surface of the metal substrate; and
   applying an immersion plated metal to the intergranular etched surface by immersing the surface in an immersion plating composition comprising [one or more plating metals selected from] tin, [silver, bismuth, copper, nickel, lead, zinc indium, palladium, platinum, gold, cadmium, ruthenium, cobalt, gallium and germanium,]
   wherein the step of intergranular etching is carried out with an intergranular etching composition comprising
   (a) hydrogen peroxide;
   (b) at least one acid, wherein the at least one acid comprises sulfuric acid or a sulfonic acid;
   (c) at least one nitrogen-containing, five-membered heterocyclic compound which does not contain any sulphur, selenium or tellurium atom in the heterocycle; and
   (d) at least one adhesive compound selected from sulfinic acids, seleninic acids, tellurinic acids, heterocyclic compounds containing at least one sulfur, selenium and/or tellurium atom in the heterocycle, and sulfonium, selenonium and telluronium salts having the general formula [(A)] (*I*),

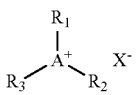

(I)

in which
   A stands for S, Se or Te;
   $R_1$, $R_2$ and $R_3$ stand for alkyl, substituted alkyl, alkenyl, phenyl, substituted phenyl, benzyl, cycloalkyl, substituted cycloalkyl, $R_1$, $R_2$ and $R_3$ being the same or different; and
   $X^-$ stands for an anion of an inorganic or organic acid or hydroxide, provided that the acid selected to constitute component (b) is not identical to the sulfinic, seleninic or tellurinic acids selected as component (d).

33. A process for treating a metal substrate to improve adhesion of polymeric materials thereto, comprising the steps of
    intergranular etching a surface of the metal substrate; and
    applying an immersion plated metal to the intergranular etched surface by immersing the surface in an immersion plating composition comprising [one or more plating metals selected from] tin, [silver, bismuth, copper, nickel, lead, zinc, indium, palladium, platinum, gold, cadmium, ruthenium, cobalt, gallium and germanium]
    wherein, when the intergranular etched surface is divided into a grid of squares 10 microns on each side, at least 50% of the squares include at least one intergranular crevice having an aspect ratio of at least 5,
    *wherein the step of intergranular etching is carried out with an intergranular etching composition comprising*
    *(a) hydrogen peroxide;*
    *(b) at least one acid, wherein the at least one acid comprises sulfuric acid or a sulfonic acid;*
    *(c) at least one nitrogen-containing, five-membered heterocyclic compound which does not contain any sulphur, selenium or tellurium atom in the heterocycle; and*
    *(d) at least one adhesive compound selected from sulfinic acids, seleninic acids, tellurinic acids, heterocyclic compounds containing at least one sulfur, selenium and/or tellurium atom in the heterocycle, and sulfonium, selenonium and telluronium salts having the general formula (I),*

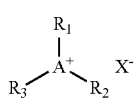

(I)

*in which*
    *A stands for S, Se or Te;*
    *$R_1$, $R_2$ and $R_3$ stand for alkyl, substituted alkyl, alkenyl, phenyl, substituted phenyl, benzyl, cycloalkyl, substituted cycloalkyl, $R_1$, $R_2$ and $R_3$ being the same or different; and*
    *$X^-$ stands for an anion of an inorganic or organic acid or hydroxide, provided that the acid selected to constitute component (b) is not identical to the sulfinic, seleninic or tellurinic acids selected as component (d).*

51. A process for treating a metal substrate to improve adhesion of polymeric materials thereto, comprising the steps of
    intergranular etching a surface of the metal substrate; and
    applying an immersion plated metal to the intergranular etched surface by immersing the surface in an immersion plating composition comprising [one or more plating metals selected from] tin, [silver, bismuth, copper, nickel, lead, zinc, indium, palladium, platinum, gold, cadmium, ruthenium, cobalt, gallium and germanium,]
    wherein the step of intergranular etching is carried out with an intergranular etching composition comprising:
    0.5 to 5% w/v hydrogen peroxide; and
    0.01 to 5% w/v of an aromatic sulfonic acid or a salt thereof,
    *wherein, when the intergranular etched surface is divided into a grid of squares 10 microns on each side, at least 50% of the squares include at least one intergranular crevice having an aspect ratio of at least 5.*

* * * * *